United States Patent
Pellizzer et al.

(10) Patent No.: US 11,538,860 B2
(45) Date of Patent: Dec. 27, 2022

(54) MEMORY ARRAY WITH GRADED MEMORY STACK RESISTANCES

(71) Applicant: Micron Technology, Inc., Boise, ID (US)

(72) Inventors: Fabio Pellizzer, Boise, ID (US); Lorenzo Fratin, Buccinasco (IT); Hongmei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 17/130,215

(22) Filed: Dec. 22, 2020

(65) Prior Publication Data
US 2021/0111226 A1    Apr. 15, 2021

Related U.S. Application Data

(62) Division of application No. 16/400,943, filed on May 1, 2019, now Pat. No. 10,910,438.

(51) Int. Cl.
| | | |
|---|---|---|
| H01L 27/24 | (2006.01) | |
| H01L 45/00 | (2006.01) | |
| H01L 23/528 | (2006.01) | |
| H01L 21/66 | (2006.01) | |
| H01L 23/532 | (2006.01) | |

(52) U.S. Cl.
CPC .......... *H01L 27/2481* (2013.01); *H01L 22/14* (2013.01); *H01L 23/528* (2013.01); *H01L 45/1233* (2013.01); *H01L 45/1253* (2013.01); *H01L 45/145* (2013.01); *H01L 45/165* (2013.01); *H01L 45/1608* (2013.01); *H01L 23/53257* (2013.01)

(58) Field of Classification Search
CPC ... H01L 27/2481; H01L 22/14; H01L 23/528; H01L 45/1233; H01L 45/1253; H01L 45/145; H01L 45/1608; H01L 45/165; H01L 23/53257; H01L 27/2463; H01L 45/06; H01L 45/141; G11C 5/025; G11C 29/025; G11C 29/50008; G11C 5/063; G11C 13/0026; G11C 13/0028; G11C 13/004; G11C 13/0069; G11C 13/0004
USPC .......................................................... 257/4
See application file for complete search history.

(56) References Cited

U.S. PATENT DOCUMENTS

| | | | |
|---|---|---|---|
| 2004/0042261 A1 | 3/2004 | Tuttle | |
| 2014/0353573 A1* | 12/2014 | Kalra | ................. H01L 27/2481 257/5 |
| 2019/0043923 A1* | 2/2019 | Ahmed | ............... H01L 27/2427 |

OTHER PUBLICATIONS

Korean Intellectual Property Office, "Notice of Reasons for Rejection," issued in connection with Korean Patent Application No. 10-2020-0052241, dated Sep. 26, 2021 (8 pages).

* cited by examiner

*Primary Examiner* — Tong-Ho Kim
(74) *Attorney, Agent, or Firm* — Holland & Hart LLP

(57) ABSTRACT

Methods, systems, and devices for memory arrays having graded memory stack resistances are described. An apparatus may include a first subset of memory stacks having a first resistance based on a physical and/or electrical distance of the first subset of memory stacks from at least one of a first driver component or a second driver component. The apparatus may include a second subset of memory stacks having a second resistance that is less than the first resistance based on a physical and/or electrical distance of the second subset of memory from at least one of the first driver component or the second driver component.

18 Claims, 14 Drawing Sheets

MEMORY ARRAY WITH GRADED MEMORY STACK RESISTANCES

CROSS REFERENCE

The present application for patent is a divisional of U.S. patent application Ser. No. 16/400,943 by Pellizzer et al., entitled "MEMORY ARRAY WITH GRADED MEMORY STACK RESISTANCES," filed May 1, 2019, assigned to the assignee hereof, and is expressly incorporated by reference in its entirety herein.

BACKGROUND

The following relates generally to operating a memory array and more specifically to memory arrays configured with graded memory stack resistance.

Memory systems are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory systems exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

A memory system may store information in a memory array that includes one or more memory layers. Multiple memory stacks or cells may be distributed across a memory layer in the memory array. Techniques for increasing the operating life, reliability, and operation of memory layers are desired.

DETAILED DESCRIPTION

Figure 1:
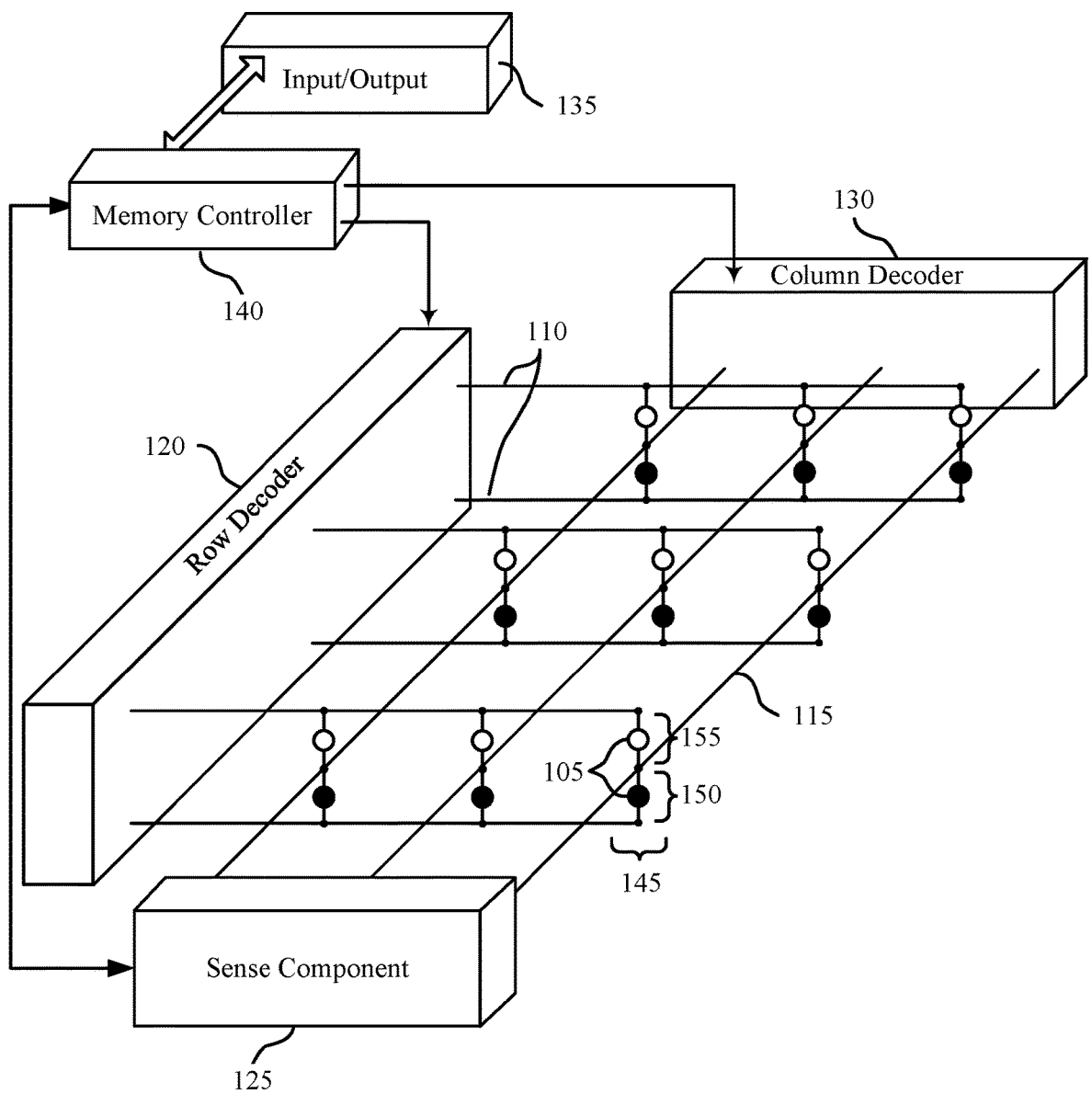
FIG. 1 illustrates an example of a memory system that supports a memory array with graded memory stack resistances as disclosed herein.

Memory devices (e.g., memory cells and/or memory stacks) may be dispersed across a memory layer. The memory devices may be accessible using decoding or access components, such as a word line driver and/or bit line driver. Certain memory devices on the memory layer may be located farther from the decoding or access components than other memory devices on the memory layer.

Memory devices that are located farther away from the decoding components may be associated with a higher "electrical distance" from the decoding components. An electrical distance of a memory device may be related to a physical distance of a memory device from the decoding components and may also be related to the length of an access path and intermediary components between the memory device and the decoding components (e.g., which may or may not be in a direct line between the memory device and one or more decoding components). Thus, in some examples, memory devices that are physically located closer to the decoding components may (or may not) have a higher electrical distance than other memory devices that are physically located farther from the memory decoding components.

Memory devices having higher electrical distances often exhibit higher "effective resistances" than memory devices having lower electrical distances—e.g., due to an increased resistance of the longer access path. An effective resistance of a memory device may include a resistance of the memory device itself (sometimes referred to as a "standalone resistance") and a resistance of any intermediary components between the memory device and the decoding components, such as the aggregate resistance of the access path, among other factors. In some examples, a standalone resistance of a memory device may include an "internal access resistance" of memory layers in a memory stack used to access a storage device—which may remain relatively constant during the operational life of the memory device with minor variations caused by temperature or other conditions or changes—and a programmable "internal storage resistance" of a storage device—which may more significantly vary over the operational life of the memory device as a function of the logic state or phase of the storage device, among other aspects.

The variation in effective resistance of different memory devices on a memory layer may affect the performance of a memory system. For example, during access operations, higher voltages may be applied across memory devices having lower effective resistances and/or electrical distances, resulting in a decreased operating life for such memory devices relative to memory devices having higher effective resistances and/or electrical distances.

Also, the application of different voltages to different memory devices may result in a non-uniform evolution of the different memory devices. That is, in an original state, all of the memory devices (e.g., memory cells and/or memory stacks) on a memory layer may share common characteristics, but throughout an operational life of a memory system, the characteristics of the memory devices may change (or "evolve") based on the applied voltages. Thus, over time, certain memory devices (e.g., memory devices with high electrical distances/effective resistances) may respond differently to applied access voltages than other memory devices (e.g., memory devices with low electrical distances/effective resistances).

Moreover, current delivery—a metric associated with the amount of time needed for an access current to reach a memory device—for memory devices having higher electrical distances and/or effective resistances (than other memory devices) may be worse than current delivery for memory devices having lower electrical distances and/or effective resistances—e.g., due to the increased length and resistance of longer access paths.

To, among other things, (1) increase the operating life of memory devices on the memory layer; (2) encourage uniform evolution across memory devices on a memory layer; and (3) improve current delivery metrics for memory devices on the memory layer, a memory layer may be constructed so that an internal access, standalone, and/or effective resistance of particular memory devices on the memory layer are selectively increased or decreased relative to other memory devices on the memory layer. By selectively forming, on a memory layer, memory devices to have different internal access, standalone, and/or effective resistances, the effects of a voltage spike may be more evenly distributed across the memory layer which will minimize the adverse effects of this condition.

In some examples, an internal access, standalone, and/or effective resistance of memory devices on a memory layer may be based on an electrical distance of the memory devices. For example, a memory layer may be constructed so that first memory devices having an electrical distance below an electrical distance threshold ("low ED memory devices") have a higher internal access and/or standalone resistance than second memory devices having an electrical distance above the electrical distance threshold ("high ED memory devices"). In some examples, a memory device having an increased internal access and/or standalone resistance also has an increased effective resistance. Accordingly, the effects of a voltage spike at the low ED memory devices may be decreased, and thus, more similar to the effects of the voltage spike at the high ED memory devices—e.g., when an internal access and/or standalone resistance of low ED memory device is increased relative to high ED memory devices.

Alternatively, the effects of a voltage spike at the high ED memory devices may be increased, and thus, may be more similar to the effects of the voltage spike at the low ED memory devices—e.g., when an internal access and/or standalone resistance of high ED memory device is decreased relative to low ED memory devices. In some examples, multiple electrical distance thresholds may be determined and multiple groups of memory devices having different resistances may be constructed. By using additional electrical distance threshold, the effects of a voltage spike more be distributed throughout a memory layer with more granularity, and thus more evenly.

In some examples, an internal access, standalone, and/or effective resistance of memory devices on a memory layer may be based on a physical location of memory devices on a memory layer. For example, a memory layer may be constructed so that first memory devices located a first distance from decoding components that is below a threshold distance ("near memory devices") have a higher internal access and/or standalone resistance than second memory devices located a second distance from the decoding components that exceeds the threshold distance ("far memory devices"). Accordingly, based on the correlation between physical location and effective resistance, the effects of a voltage spike at the near memory devices may be reduced or the effects of a voltage spike at the far memory devices may be increased, and thus, the effects of the voltage spike may be more evenly distributed across all of the near memory devices. For the reasons discussed above, in some examples, multiple threshold distances may be determined.

In some examples, first memory devices (e.g., near or low ED memory devices) are formed to have a higher internal access and/or standalone resistance than second memory devices (e.g., far or high ED memory devices) as follows. In one example, while forming the memory devices on a memory layer, an internal access and/or standalone resistance of the second memory devices may be reduced by selectively removing all or a portion of a resistive material from a resistive layer in the second memory devices. In another example, an internal access and/or standalone resistance of the first memory devices may be increased by selectively removing a portion of an electrode layer from the first memory devices and selectively adding, to the first memory devices, a less conductive electrode layer on top of the remaining portion of the electrode layer. In another example, an internal access and/or standalone resistance of the first memory devices may be increased by treating the first memory devices with a plasma that increases the internal access and/or standalone resistance of a resistive layer in the first memory devices. In another example, an internal access and/or standalone resistance of the first memory devices may be increased by implanting ions in one or more layers of the first memory devices.

Features of the disclosure introduced above may be performed alone or in combination with one another. For example, any combination of the above techniques for forming memory devices with different internal access and/or standalone resistances may be used to construct multiple regions of memory devices.

Features of the disclosure introduced herein are further described in the context of a memory system. Specific examples are described of memory layers having graded memory stack resistances and of memory stacks used to form memory layers having graded memory stack resistances. These and other features of the disclosure are further illustrated by and described with reference to apparatus diagrams, system diagrams, and flowcharts that relate to graded memory stack resistances.

FIG. 1 illustrates an example of a memory system that supports a memory array with graded memory stack resistances as disclosed herein. Memory system 100 may also be referred to as an electronic memory apparatus.

Memory system 100 may be a three-dimensional (3D) memory array, where two-dimensional (2D) memory arrays are formed on top of one another. This may increase the number of memory cells that may be formed on a single die or substrate as compared with 2D arrays, which in turn may reduce production costs or increase the performance of the memory array, or both. According to the example depicted in FIG. 1, memory system 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. Memory cell stack 145 may include multiple memory layers including first memory layer 150 and second memory layer 155. In some examples, first memory layer 150 may include all of the lower memory cells in memory system 100 (i.e., all of the memory cells filled in with black as depicted in FIG. 1. Memory system 100 includes memory cells 105 that are programmable to store different states.

Each memory cell 105 may be programmable to store two states, denoted a logic 0 and a logic 1. In some examples, memory cell 105 may be configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or paraelectric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties. Or in some examples, chalcogenide-based and/or phase change materials may be employed.

A memory cell 105 may, in some embodiments, include a self-selecting memory cell. In some examples, the memory cell (e.g., self-selecting memory cell) may include a material that remains in an amorphous state that may have a threshold voltage associated with it—that is, a current may flow after an applied voltage exceeds the threshold voltage. Thus, if the applied voltage is less than the threshold voltage, no appreciable amount of current may flow. In some embodiments, the current flow or lack thereof, may be sensed by a sense component 125 as described with reference to FIG. 1 to read stored information in the selected memory cell. In some embodiments, the material may be a chalcogenide alloy. Composition of the chalcogenide alloy may be locally modified upon applying a programming pulse and the memory cell 105 may exhibit a certain number of different threshold voltage levels (e.g., two or more threshold voltage levels). Thus, the memory cell 105 may be able to store one or more bits of data.

Each row of memory cells 105 may be connected to an access line 110, and each column of memory cells 105 may be connected to a bit line 115. Access lines 110 may also be known as word lines 110, and bit lines 115 may also be known as digit lines 115. References to word lines and bit lines, or their analogues, are interchangeable without loss of understanding or operation. Word lines 110 and bit lines 115 may be substantially perpendicular to one another to create an array. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. Or, the first and second layers may both have their own word and bit line. That is, the top electrode of lower memory cell 105 may be in electronic communication with a first digit line and the bottom electrode of upper memory cell 105 may be in electronic communication with a second digit line. In some examples, a third access line may be present and may be used to activate and deactivate a selector device.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

As discussed herein, electrodes may be coupled to a memory cell 105 and a word line 110 or a bit line 115. The term electrode may refer to an electrical conductor, and in some examples, may be employed as an electrical contact to a memory cell 105. An electrode may include a trace, wire, conductive line, conductive layer, or the like that provides a conductive path between elements or components of memory system 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

In some architectures, the logic storing device of a cell (e.g., a resistor in a PCM cell, a capacitor in a FeRAM cell) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding bit line 115. The digit line may then be accessed to either read or write the memory cell 105. Upon selecting a memory cell 105, the resulting signal may be used to determine the stored logic state. In some examples, a first logic state may correspond to no current or a negligibly small current, whereas a second logic state may correspond to a finite current. In some examples, a memory cell 105 may include a self-selecting memory cell having two terminals and may not need a separate selection component. As such, one terminal of the self-selecting memory cell may be electrically connected to a word line 110 and the other terminal of the self-selecting memory cell may be electrically connected to a bit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some examples, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some examples, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some embodiments, a series of predetermined voltages may be applied to determine one of two or more threshold voltage levels stored in a self-selecting memory cell. The predetermined voltage levels may increase in magnitude to detect a particular threshold voltage of the self-selecting memory cell in linear mode. Alternatively, the predetermined voltage levels may increase or decrease in magnitude to detect a particular threshold voltage of the self-selecting memory cell in a binary search mode. The predetermined voltage levels may have a same polarity with a voltage used to program the self-selecting memory cell. The predetermined voltage levels may have an opposite polarity with a voltage used to program the self-selecting memory cell. A range of the predetermined voltage may be determined by a range of the threshold voltage of the self-selecting memory cell.

Sense component 125 may include various transistors or amplifiers to detect and amplify a signal, which may be referred to as latching. The latched signal may correspond to a logic state of memory cell 105 and may be output as output 135. In some examples, the accuracy of sense component 125 may be dependent on a sensing window for a memory cell. For example, a larger sensing window may allow for more variation in the voltage or current induced on a bit line 115 by a memory cell 105 and provided to the sense component 125 for sensing. In some examples, sense component 125 may be a part of column decoder 130 or row decoder 120. Or, sense component 125 may be connected to or in electronic communication with column decoder 130 or row decoder 120.

A memory cell 105 may be set or written by similarly activating the relevant word line 110 and bit line 115 and at least one logic value may be stored in the memory cell 105. Column decoder 130 or row decoder 120 may accept data, for example input/output 135, to be written to the memory cells 105. In the case of a self-selecting memory cell including a chalcogenide alloy, a memory cell 105 may be written to store data by applying a programming pulse having a single polarity, for example, by modifying a local composition of the alloy. The programming pulse may have various shapes depending on a specific threshold voltage to be established at the self-selecting memory cell.

In some memory architectures, accessing the memory cell 105 may degrade or destroy the stored logic state and re-write or refresh operations may be performed to return the original logic state to memory cell 105. But in non-volatile memory, such as self-selecting memory, PCM, FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some examples, one or more of row decoder 120, column decoder 130, and sense component 125 may be co-located with the memory controller 140. Memory controller 140 may generate row and column address signals to activate the desired word line 110 and bit line 115.

Memory controller 140 may also generate and control various voltages or currents used during the operation of memory system 100. For example, the memory controller 140 may determine a desired logic state of a self-selecting memory cell and a shape of a programming pulse having a single polarity based on a threshold voltage corresponding to the desired logic state of the self-selecting memory cell and apply the programming pulse to the self-selecting memory cell. In general, the amplitude, shape, or duration of an applied voltage or current discussed herein may be adjusted or varied and may be different for the various operations discussed in operating the memory system 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

As depicted in FIG. 1, memory cells may be dispersed or distributed across a memory layer. In some examples, each memory cell may be formed using a same process, and thus, each memory cell may share certain characteristics, such as a resistance. This may facilitate the use of a reduced number of operating voltages (e.g., one set of operating voltages) to access all of the memory cells on a memory layer. That said, some memory cells on a memory layer may be physically located nearer to row decoder 120 and/or column decoder 130 than other memory cells on the memory layer. Accordingly, while having similar standalone characteristics, certain memory cells may be associated with different system-level characteristics, such as "electrical distance," "effective resistance," and "current delivery."

The electrical distance of a memory cell may be related to a physical distance of the memory cell from row decoder 120 and/or column decoder 130. For example, a memory cell that is located farther from row decoder 120 and/or column decoder 130 may have a larger electrical distance than a memory cell that is located nearer to row decoder 120 and/or column decoder 130. The effective resistance of a memory cell may be linked to an electrical distance of the memory cell, and by extension, to the physical distance of the memory cell from row decoder 120 and/or column decoder 130. For example, a memory cell having a larger electrical distance relative to row decoder 120 and/or column decoder 130 may have a higher effective resistance than a memory cell having a smaller electrical distance relative to row decoder 120 and/or column decoder 130.

Current delivery (e.g., the time needed for an access current to reach a memory cell) for a memory cell may also be linked to an electrical distance, effective resistance, and/or physical distance of the memory cell from row decoder 120 and/or column decoder 130. For example, the current delivery for a memory cell may increase with effective resistance, electrical distance, and/or physical distance of the memory cell from row decoder 120 and/or column decoder 130. In some examples, the current delivery of a memory cell having a same electrical distance as another memory cell may be improved relative to the current delivery of the other memory cell when the effective resistance of the memory cell is lower than the effective resistance of the other memory cell—e.g., if the internal access and/or standalone resistance of the memory cell is lower than the internal access and/or standalone resistance of the other memory cell.

Throughout the operating life a memory system 100, the characteristics of memory cells in memory system 100 may change, or evolve, in a process which may be referred to as "evolution." In some examples, memory system 100 is configured such that the characteristics of all of the memory cells on a memory layer are expected to change in a uniform fashion, allowing one set of operating voltages to be used to access the memory cells throughout the life of memory system 100. In some examples, the characteristics of memory cells change over time as a function of the voltages applied across the memory cells—e.g., the characteristics may change at a faster pace if higher voltages are used. Additionally, over time and with extended use, the performance of the memory cells may degrade to a point where memory system 100 is no longer operable. In some examples, the application of higher voltages across memory cells may cause the memory cells to degrade at a faster rate.

In some examples, accessing a memory cell on a memory layer results in a voltage spike throughout the memory layer—e.g., due to the charging of inherent capacitance in the memory layer. Due to the varying effective resistances of memory cells on the memory layer, the effects of the voltage spike may be unevenly distributed throughout the memory layer. For example, memory cells having lower effective resistances/electrical distances (e.g., memory cells located near row decoder 120 and/or column decoder 130) may experience a larger component of the voltage spike while memory cells having higher effective resistances/electrical distances (e.g., memory cells located far row decoder 120 and/or column decoder 130) may experience a smaller component of the voltage spike—e.g., the effects of the voltage spike at farther memory cells may be attenuated by the larger resistance of the longer access paths.

Accordingly, a change in memory cell characteristics across a memory layer may occur in an inconsistent fashion—e.g., the characteristics of memory cells having lower electrical distances may change at a faster rate than the characteristics of memory cells having higher electrical distances. As a result, certain memory cells may exhibit a preferred response to one set of access voltage than other memory cells. Also, the performance of memory cells having lower electrical distances may degrade quicker than the performance of memory cells having higher electrical distances.

To, among other things, (1) encourage uniform evolution across memory cells on a memory layer; (2) increase the operating life of memory cells on the memory layer; and (3) improve current delivery parameters for memory cells on the memory layer, a memory layer may be constructed so that an internal access and/or standalone resistance of particular memory cells on the memory layer are selectively increased or decreased relative to other memory cells on the memory layer. By forming, on a memory layer, memory cells having different resistances, the effects of a voltage spike may be more evenly distributed across the memory layer. That is, by decreasing an internal access, standalone, and/or effective resistance of memory cells located far from row decoder 120 and/or column decoder 130 relative to memory cells located near row decoder 120 and/or column decoder 130, the effects of a voltage spike at those memory cells may be increased to be closer to the effects of the voltage spike at the nearer memory cells.

In some examples, an internal access, standalone, and/or effective resistance of memory cells on a memory layer may be based on an electrical distance of the memory cells. For example, a memory layer may be constructed so that first memory cells having an electrical distance above an electrical distance threshold ("high ED memory cells") also have a lower internal access, standalone, and/or effective resistance than second memory cells having an electrical distance below the electrical distance threshold ("low ED memory cells"). Accordingly, the effects of a voltage spike at the high ED memory cells may be more similar to the effects of the voltage spike at the low ED memory cells—e.g., because the effective resistance of the high ED memory cells may be reduced, and thus, closer to the effective resistance of the low ED memory cells. In some examples, multiple electrical distance thresholds may be determined and multiple groups of memory cells having different resistances may be constructed. By using additional electrical distance threshold, the effects of a voltage spike more be distributed throughout a memory layer with more granularity, and thus more evenly.

In some examples, an internal access, standalone, and/or effective resistance of memory cells on a memory layer may be based on a physical location of memory cells on a memory layer. For example, a memory layer may be constructed so that first memory cells located a distance from row decoder 120 and/or column decoder 130 exceeding a threshold distance ("far memory cells") have a lower internal access, standalone, and/or effective resistance than second memory cells located a distance from row decoder 120 and/or column decoder 130 below the threshold distance ("near memory cells"). Accordingly, due to the correlation between physical location and effective resistance, the effects of a voltage spike at the far memory cells may be increased and more similar to the effects of the voltage spike at the near memory cells—e.g., because the effective resistance of the far memory cells may be reduced, and thus, closer to the effective resistance of the near memory cells. For the reasons discussed above, in some examples, multiple threshold distances may be determined.

In some examples, first memory cells (e.g., near or low ED memory cells) are formed to have a higher internal access and/or standalone resistance than second memory cells (e.g., far or high ED memory cells) as follows. In one example, while forming the memory cells on a memory layer, a resistance of the second memory cells may be reduced by selectively removing all or a portion of a resistive material from a resistive layer in the second memory cells. In another example, a resistance of the first memory cells may be increased by selectively removing a portion of an electrode layer from the first memory cells and selectively adding, to the first memory cells, a less conductive electrode layer on top of the remaining portion of the electrode layer. In another example, a resistance of the first memory cells may be increased by treating the first memory cells with a plasma that increases the resistance of a resistive layer in the first memory cells. In another example, a resistance of the first memory cells may be increased by implanting ions in one or more layers of the first memory cells.

Figure 2:
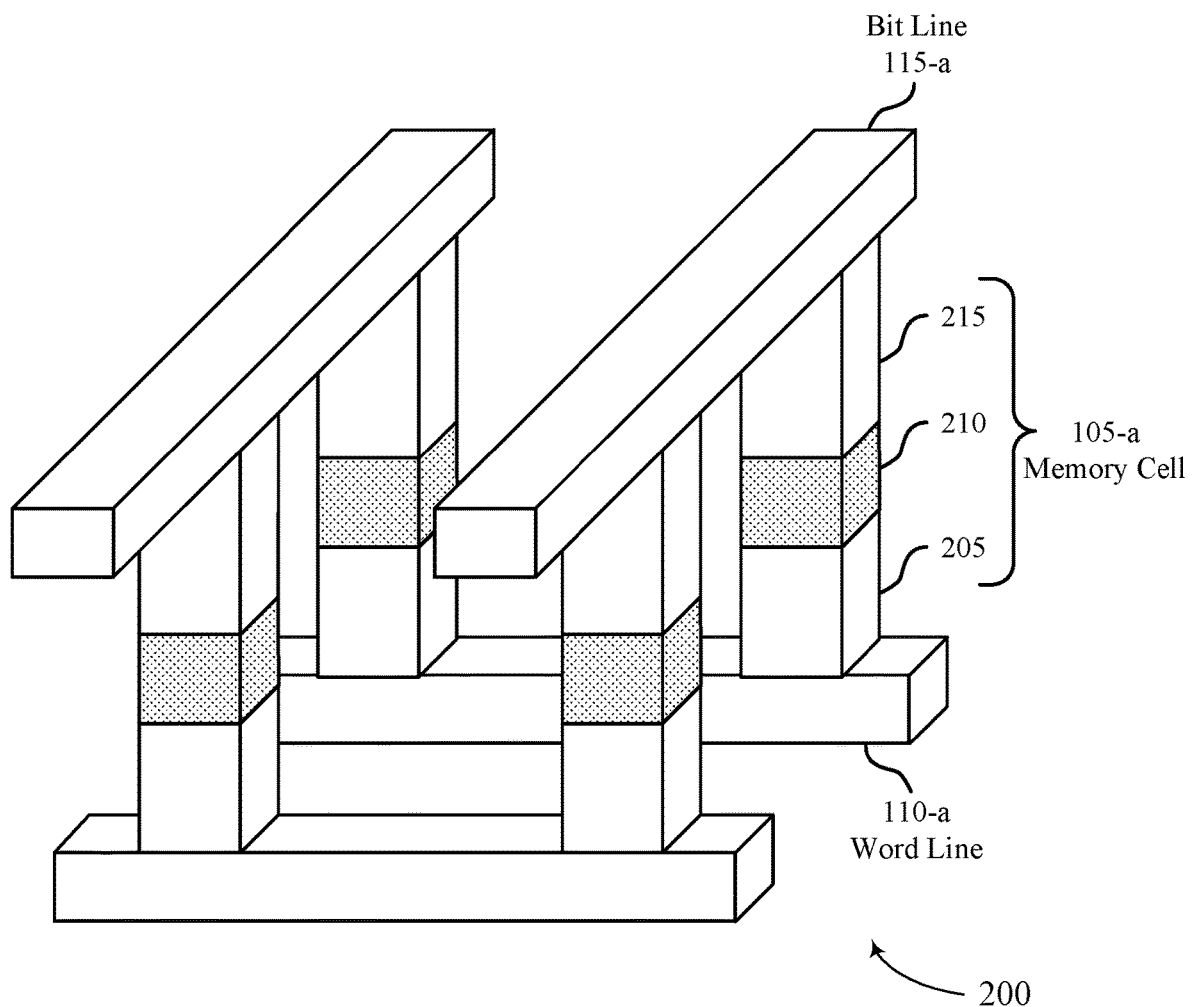
FIG. 2 illustrates an example cross-section of a memory array that supports graded memory stack resistances as disclosed herein.

FIG. 2 illustrates an example cross-section of a memory array that supports graded memory stack resistances as disclosed herein.

Memory array 200 may be configured to store electronic data and may be an example of aspects of memory system 100 of FIG. 1. The structure of memory array 200 may be referred to as a cross-point architecture. It may also be referred to as a pillar structure. For example, as shown in FIG. 2, a pillar may be in contact with a first conductive line (word line 110-a) and a second conductive line (bit line 115-a). Such a pillar architecture may offer high-density data storage with low production costs. For example, the cross-point architecture may have memory cells with a reduced area and, resultantly, an increased memory cell density compared to at last some other architectures. In some examples, the architecture may have a $4F^2$ memory cell area, where F is the smallest feature size, compared to other architectures with a $6F^2$ memory cell area, such as those with a three-terminal selection.

Memory array 200 may be made by various combinations of material formation and removal. For example, layers of material may be deposited or otherwise formed that correspond to word line 110-a, memory cell 105-a, and bit line 115-a. Material may be selectively removed to then create the desired features, such as the pillar structure depicted in FIG. 2. For example, features may be defined using photolithography to pattern a photoresist and then material may be removed by techniques such as etching. Bit lines 115-a may then be formed, for example, by depositing a layer of material and selectively etching to form the line structure depicted in FIG. 2. In some examples, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

In some examples, a 3D memory array may be formed by stacking multiple memory structures, such as memory array 200, on one another. For example, a second memory array may be stacked on top of memory array 200. In some examples, the two stacked memory arrays may have common conductive lines such that each level may share word lines 110 or bit lines 115 as described with reference to FIG. 1. In such cases, memory array 200 may be referred to as a first memory layer and the upper memory array may be referred to as a second memory layer. In some examples, first decoding circuitry may be used to access the first memory layer and second decoding circuitry may be used to access memory devices on the second memory layer. In other cases, one set of decoding circuitry may be used to access memory devices on both the first memory layer and the second memory layer. For example, the decoding circuitry may be located below both the first memory layer and the second memory layer. In some examples, an electrical distance of memory devices located on the upper memory layer is greater than an electrical distance of memory devices located on the lower memory layer.

Memory array 200 includes memory cell 105-a, first access line 110-a (e.g. word line 110-a), and second access line 115-a (e.g. bit line 115-a), which may be examples of a memory cell 105, word line 110, and bit line 115, as described with reference to FIG. 1. Memory cell 105-a may be formed in a similar fashion as memory array 200 and may include layers of material that correspond to bottom electrode 205, storage device 210, and top electrode 215. Memory cell 105-a may be a target memory cell—e.g. a memory cell that has been selected for a memory operation (e.g., a read operation or a write operation).

In some examples, memory array 200 may include a selector device (or selector component) and/or additional access lines to operate the selector device. The selector device may aid in selecting a particular memory cell 105-a or may help prevent stray currents from flowing through non-selected memory cells 105-a adjacent a selected memory cell 105-a. For example, the selector device may have a threshold voltage such that a current may flow through the selector device when the threshold voltage is met or exceeded. The selector device may be connected in series between memory cell 105-a and at least one of word line 110-a or bit line 115-a. For example, the selector device may be located in series between bottom electrode 205 and word line 110-a. In some examples, the selector device may include a metal-oxide-semiconductor field-effect transistor (MOSFET), bipolar junction transistor (BJT), diode, or ovonic threshold switch (OTS).

In other cases, memory array 200 may include self-selecting memory cells, and memory cell 105-a may be a self-selecting memory cell, in which case a selector device may not be used. When memory cell 105-a is a self-selecting memory cell, storage device 210 may be composed of a chalcogenide material. For example, storage device 210 may include a chalcogenide glass such as, an alloy of selenium (Se), tellurium (Te), arsenic (As), antimony (Sb), carbon (C), germanium (Ge), and silicon (Si). In some embodiments, a chalcogenide alloy having primarily selenium (Se), arsenic (As), and germanium (Ge) may be referred to as SAG-alloy. In some embodiments, the chalcogenide glass may include additional elements such as hydrogen (H), oxygen (O), nitrogen (N), chlorine (Cl), or fluorine (F), each in atomic or molecular forms. In some examples, the chalcogenide glass may include additional Group III elements such as Boron (B), Gallium (Ga), Indium (In), Aluminum (Al) and/or Group IV elements such as Silicon (Si) or Tin (Sn).

In some embodiments, a self-selecting memory cell may be programmed to exhibit a particular threshold voltage by applying a programming pulse to the self-selecting memory cell using bit line 115-a and word line 110-a—e.g., a voltage may be applied across memory cell 105-a by applying opposite polarity voltages to bit line 115-a and word line 110-a. The particular threshold voltage, one of two or more threshold voltage levels, may be established by modifying a local composition of storage device 210. The programming pulse may have various shapes (e.g., multiple voltage or current levels and time durations) depending on a specific threshold voltage level intended for the self-selecting memory cell.

Subsequently, in some embodiments, a series of read pulses having predetermined voltages may be applied to the self-selecting memory cell using the bit line 115 and the word line 110. The predetermined voltage levels of the read pulses may increase or decrease in magnitude to detect the particular threshold voltage of the self-selecting memory cell. In some embodiments, the predetermined voltage of the read pulse may have a same polarity with the voltage of the programming pulse used to program the self-selecting memory cell. In some embodiments, the predetermined voltage of the read pulse may have an opposite polarity with the voltage of the programming pulse used to program the self-selecting memory cell.

In some examples, a voltage spike throughout memory array 200 may result from the application of the programming pulse to memory array 200. That is, the application of a programming pulse to word line 110-a and/or bit line 115-a may rapidly charge inherent capacitance(s) within memory array 200, creating a voltage spike in those areas. The effects of the voltage spike may be attenuated in areas of memory array 200 that are located farther from the source of the programming pulse due to the increased resistance between the farther areas and the source—e.g., the increased resistance may slow the charging of inherent capacitance(s) in the farther areas.

As discussed herein, the uneven distribution of the effects from voltage spike caused by the application of programming pulses may result in the nonuniform evolution of memory cells in memory array 200 and the accelerated degradation of memory cells located near the source of programming pulses. Also, the increased resistance of memory cells located farther from the source of the programming pulses may result in current delivery parameters for those memory cells being worse than for memory cells located near the source of the programming pulses.

In some examples, memory array 200 may include resistive layers (or resistors). For example, a resistor may be located between word line 110-a and bottom electrode 205. In some examples, another resistor may be located between bit line 115-a and top electrode 215. The resistors may be composed of WSiN. In some examples, the resistor may prevent or reduce the flow of stray currents through nontargeted memory cells.

In some examples, a memory stack may include a portion of bit line 115-a, top electrode 215, storage device 210, bottom electrode 205, a portion of word line 110-a. In some examples, the memory stack may also include one or more resistors and/or a selector device. A "standalone resistance" of the memory stack may include a combined resistance of the portion of the bit line 115-a, top electrode 215, storage device 210, bottom electrode 205, the portion of word line 110-a and any other components located in the memory stack (e.g., a resistor or selector device). The standalone resistance of the memory stack may include the combined resistance of an "internal access resistance" and an "internal storage resistance"— e.g., the resistance of the internal access resistance and the internal storage resistance. In some examples, the internal access resistance may include the resistance of material layers and/or components used to access storage device 210, such as the resistance of bit line 115-a, top electrode 215, bottom electrode 205, and word line 110-a. The internal access resistance may remain relatively constant during the operational life of the memory stack compared with the internal storage resistance, although it may vary to some degree as a function of temperature or other conditions. The internal storage resistance may, for example, include the resistance of storage device 210 and, in some examples, a selector device. The internal storage resistance may vary more significantly during the operational life of the memory stack (e.g., as a function of the current logic state of storage device 210 and/or whether the selector device is activated).

In other cases, a memory stack may include top electrode 215, storage device 210 and bottom electrode 205, and may not include bit line 115-a or word line 110-a, and the standalone resistance and internal access resistance may similarly exclude the resistances of bit line 115-a and/or word line 110-a.

Figure 3:
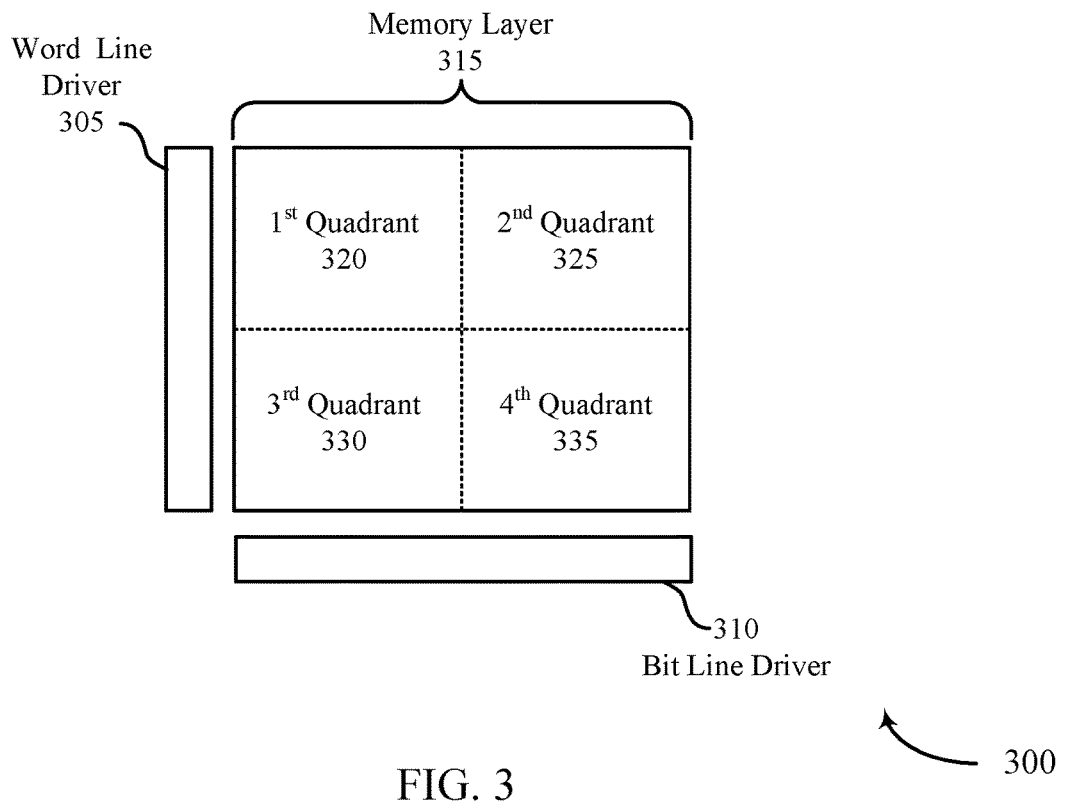
FIGS. 3 and 4 illustrate examples of memory structures that support graded memory stack resistances as disclosed herein.

FIG. 3 illustrates an example of a memory structure that supports graded memory stack resistances as disclosed herein. Memory structure 300 may be configured to store and provide information. Memory structure may include word line driver 305, bit line driver 310, and memory layer 315.

Word line driver 305 may be configured to apply at least a portion of an access voltage to a memory cell or stack (also referred to herein as a "memory device") located in memory layer 315. Word line driver 305 may apply the voltage to the memory device via a word line, as discussed herein. In some examples, word line driver 305 may include multiple word line drivers, where each word line driver may be coupled with a respective word line. Word line driver 305 may include a power amplifier. In some examples, word line driver 305 may be an example of or included in row decoder 120 of FIG. 1.

Bit line driver 310 may be configured to apply at least a portion of an access voltage to a memory cell or stack located in memory layer 315. In some case, bit line driver 310 may apply the voltage to the memory device via a bit line, as discussed herein. In some examples, bit line driver 310 and word line driver 305 apply a voltage across the memory device by applying concurrent voltages to a top and bottom of the memory device. In some examples, the voltage applied by the bit line driver 310 has an opposite polarity than the voltage applied by the word line driver 305. In some examples, may include multiple bit line drivers, where each bit line driver is coupled with a respective bit line. Bit line driver 310 may include a power amplifier. In some examples, bit line driver 310 may be an example of or included in column decoder 130 of FIG. 1.

In some examples, word line driver 305 and/or bit line driver 310 may be arranged differently than as depicted in FIG. 3. For example, word line driver 305 may be located at the top, right, or bottom side of memory layer 315 and bit line driver 310 may be located at the top, left, or right side of memory layer 315, or any combination thereof. In some examples, word line driver 305 and/or bit line driver 310 may be located underneath memory layer 315.

Memory layer 315 may be configured to support an array of memory devices. That is, memory devices may be evenly dispersed across memory layer. Each memory device on memory layer 315 may be accessible via one word line and one bit line. For example, a memory device that may be coupled with a first word line and a first bit line may be accessed when word line driver 305 applies a first voltage to the first word line and bit line driver 310 applies a second voltage to the first bit line.

Memory layer 315 may be partitioned (e.g., either physically or virtually/conceptually) into multiple regions (e.g., first quadrant 320, second quadrant 325, third quadrant 330, and fourth quadrant 335). As merely one example, first quadrant 320 may include memory devices that are located, as a matter of distance, near word line driver 305 and far from bit line driver 310. First quadrant 320 may also be referred to as "near-far quadrant" and memory devices within first quadrant 320 may be referred to as "near-far memory devices." Second quadrant 325 may include memory devices that are located, as a matter of distance, far from word line driver 305 and far from bit line driver 310. Second quadrant 325 may also be referred to as the "far-far quadrant" and memory devices within second quadrant 325 may be referred to as "far-far memory devices."

Third quadrant 330 may include memory devices that are located, as a matter of distance, near word line driver 305 and near bit line driver 310. Third quadrant 330 may also be referred to as the "near-near quadrant" and memory devices within third quadrant 330 may be referred to as "near-near memory devices." And fourth quadrant 335 may include memory devices that are located, as a matter of distance, far from word line driver 305 and near bit line driver 310. Fourth quadrant 335 may also be referred to as the "far-near quadrant" and memory devices within fourth quadrant 335 may be referred to as "far-near memory devices." In some examples, memory layer 315 may be partitioned into any number N of regions (e.g., from two to many of regions).

In some examples, a distance from a memory device on memory layer 315 to both word line driver 305 and bit line driver 310 may be referred to as the "electrical distance" of the memory device. This electrical distance may be a composite electrical distance relating to two other electrical distances (e.g., a distance from a memory device on memory layer 315 to word line driver 305, a distance from a memory device on memory layer 315 to bit line driver 310).

In some examples, memory devices located physically farther from one or both of word line driver 305 and bit line driver 310—e.g., memory devices located in second quadrant 325—may have larger electrical distances than memory devices located physically nearer to one or both of word line driver 305 and bit line driver 310—e.g., memory devices located in the other quadrants. That said, not all of memory devices in second quadrant 325 will necessarily have larger electrical distances than memory devices in the other quadrants—e.g., certain memory devices in first quadrant 320 (e.g., a memory device located in the top right corner of first quadrant 320) may have larger electrical distances than certain memory devices located in second quadrant 325 (e.g., a memory device located in the bottom left corner of second quadrant 325). In some examples, the electrical distance may be determined as the root mean square of a first distance between word line driver 305 and a memory device and a second distance between bit line driver 310 and the memory device or as the Euclidean distance of the memory device to a particular location on memory layer 315—e.g., the left bottom corner.

Also, in some examples, memory devices having different electrical distances may be non-contiguously distributed throughout memory layer 315. For example, memory devices having high electrical distances may be located in at least some if not each of the four quadrants as discussed in more detail in FIG. 9.

In some examples, an "effective resistance" of a memory device on memory layer 315 relative to word line driver 305 and/or bit line driver 310 may include the resistance of the memory device itself, the resistance of the word and bit lines used to access the memory device, and the resistance of any intermediary components. Because of the longer access paths, memory devices that may be physically located farther from word line driver 305 and/or bit line driver 310 may have a higher effective resistance than memory devices that are physically located closer to word line driver 305 and/or bit line driver 310. For example, memory devices located in second quadrant 325 may have higher effective resistances than memory devices located in the other quadrants. As memory devices located physically farther from word line driver 305 and/or bit line driver 310 may have larger electrical distances than memory devices located closer to word line driver 305 and/or bit line driver 310, memory devices with larger electrical distances also may have larger effective resistances than memory devices with smaller electrical distances.

In some examples, applying an access voltage to a memory device on memory layer 315 results in a voltage spike throughout all or a portion of memory layer 315—e.g., due to an inherent capacitance of memory layer 315. Due to the different effective resistances of memory devices throughout memory layer 315, the effects of the voltage spike may vary throughout memory layer 315. For example, the effects of the voltage spike may be attenuated in areas of memory layer 315 that are located farther away from word line driver 305 and/or bit line driver 310—e.g., a larger component of the voltage spike may be applied across a memory device that has a small electrical distance and is located in third quadrant 330 than a memory device that has a large electrical distance and is located in second quadrant 325.

Over time, the application of different voltages to different memory devices on memory layer 315 may cause inconsistent aging of the memory devices. That is, the memory devices on memory layer 315 may be originally configured to share similar or related characteristics (e.g., may have a linear relationship). But throughout the memory device's operational life applying different actual voltages across different memory devices may cause the characteristics of the memory devices to vary from one another or lose their relationships. The changing of a memory device's characteristics over time may be referred to as the "evolution" of the memory device. The operation of memory devices having nonuniform or unrelated characteristics may be more complex than the operation of memory devices having uniform or related characteristics—e.g., different access voltages may be required to access different memory devices on a same memory layer. A "cross-tile" parameter may be used to measure the uniformity of memory devices on a memory layer, where a preferred cross-tile parameter is associated with all of the memory devices on a memory layer respond similarly to the same inputs.

Also, the operational life of memory devices with small electrical distances may be shorter than memory devices with large electrical distances because of larger voltages being applied across memory devices with the low electrical distances.

Also, accessing memory devices located far from word line driver 305 and/or far from the bit line driver 310 may introduce additional latency into an access operation relative to memory devices located near word line driver 305 and/or bit line driver 310—e.g., it may take longer to access a memory device that has a larger electrical distance in second quadrant 325 than a memory device that has a smaller electrical distance in third quadrant 330. The amount of time for accessing a memory device on memory layer 315 may be referred to as "current delivery."

To, among other things, (1) ensure that memory devices on memory layer 315 age in a uniform manner; (2) increase the operational life of memory devices with small electrical distances and/or effective resistances; and/or (3) improve current delivery for memory devices with large electrical distances and/or effective resistances, memory devices on memory layer 315 may be constructed, or formed, such that, before operation of the memory devices, a resistance of first memory devices having first electrical distances and/or effective resistances is higher than a resistance of second memory devices having larger second electrical distances and/or effective resistances.

Figure 5:
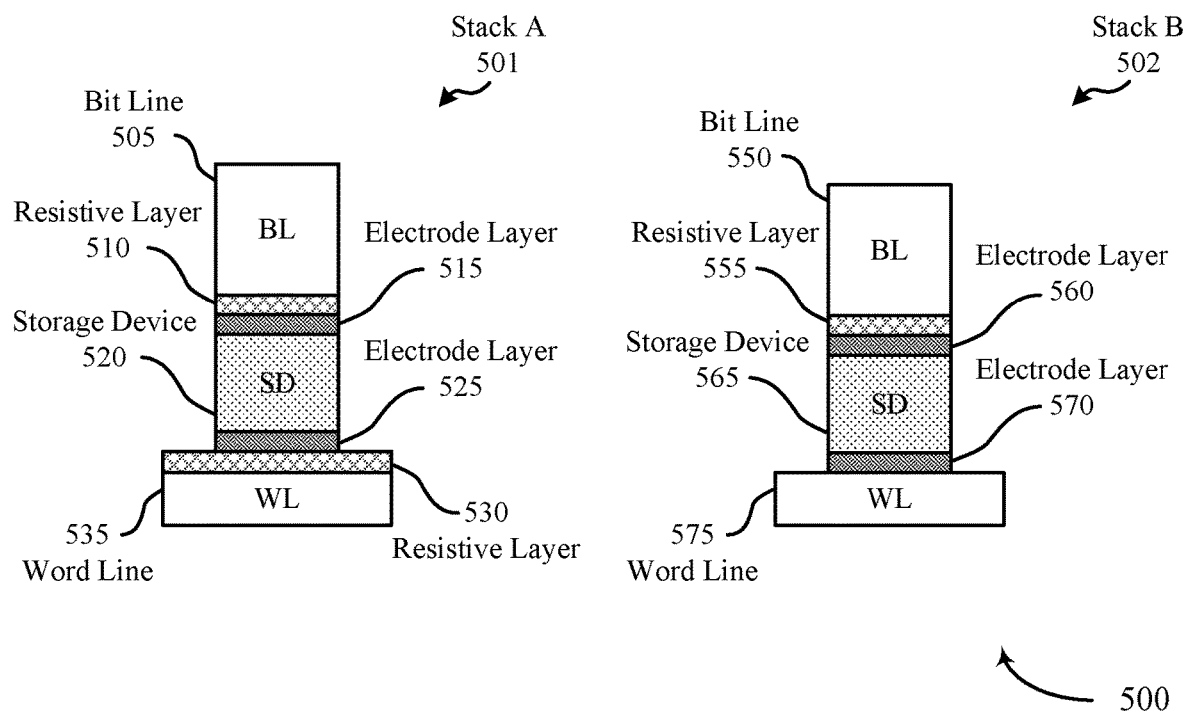
FIGS. 5 and 6 illustrate examples of memory stack configurations used in a memory array with graded memory stack resistances as disclosed herein.

In some examples, to construct first memory devices with higher resistances than second memory devices on a memory layer, a resistance of the first memory devices may be increased relative to a resistance of the second memory devices, as discussed herein and at least with reference to FIG. 5. In some examples, a resistance of the first memory devices may be increased by adding an additional resistive layer to the first memory devices; forming an electrode bi-layer including a decreased conductivity/higher resistivity electrode layer to the first memory devices; increasing a resistivity of one or more memory layers of the first memory devices by treating the surface of the one or more memory layers (e.g., by applying a dinitrogen ($N_2$) plasma to one or more of the memory layers); or increasing a resistivity of the one or more memory layers of the first memory devices by implanting ions into the one or more memory layers. By increasing a resistance of the first memory devices, the effects of voltage spikes may be diminished at the first memory devices, and thus, the effects may be more evenly distributed across memory layer 315. Accordingly, the characteristics of the first and second memory devices may change at a uniform pace.

Figure 6:
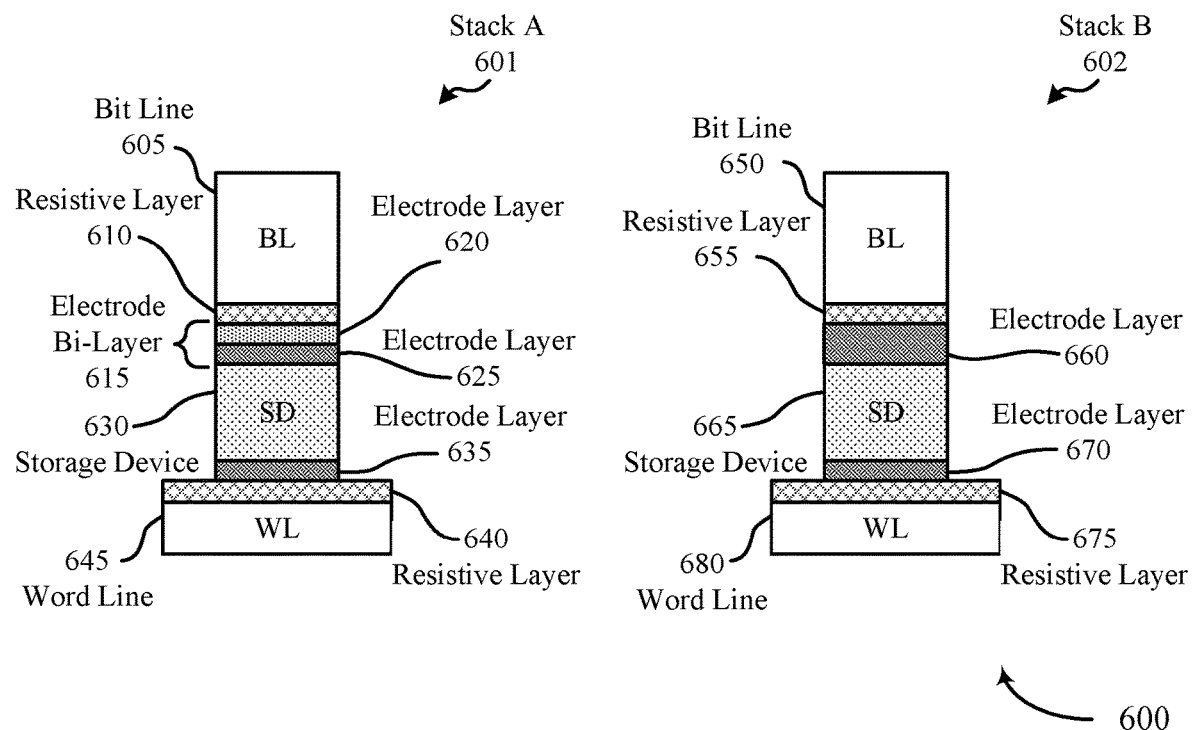

In other examples, to construct first memory devices with higher resistances than second memory devices on a memory layer, a resistance of the second memory devices may be decreased relative to a resistance of the first memory devices, as discussed herein and at least with reference to FIG. 6. In some examples, the resistance of the second memory devices may be decreased by removing all or a portion of at least one resistive layer of the second memory devices; or by increasing a conductivity or reducing a resistivity of one or more memory layers of the second memory devices. By decreasing a resistance of the second memory devices, the effects of voltage spikes may be increased at the second memory devices, and thus, the effects may be more evenly distributed across memory layer 315. Accordingly, the characteristics of the first and second memory devices may change at a uniform pace. Also, by decreasing a resistance of the second memory devices, current delivery from and to the second memory devices may be enhanced—i.e., less time may be used for accessing the second memory devices.

In some examples, additional memory devices having different electrical distances may be selectively formed on memory layer 315 to have different resistances. For example, third memory devices having third electrical distances larger than the second electrical distances and fourth memory devices having fourth electrical distances larger than the third electrical distances may be formed on memory layer 315. In such cases, a resistance of the third memory devices may be lower than the resistance of the second memory devices, and a resistance of the fourth memory devices may be lower than the resistance of the third memory devices, as discussed herein and at least with reference to FIGS. 7-11. By further differentiating a configuration of memory layer 315 by additional electrical distances, the effects of a voltage spike may be distributed throughout memory layer 315 with more granularity.

In some examples, memory structure 300 may include additional memory layers, word line drivers, and/or bit line drivers. For example, memory structure 300 may include an additional memory layer that is located above memory layer 315, as well as a second word line driver located above word line driver 305 and a second bit line driver located above bit line driver 310. The additional memory layer may be similarly partitioned into four quadrants and the second word line driver and the second bit line driver may be configured to access memory devices on the additional memory layer.

In other examples, word line driver 305 and bit line driver 310 may be located underneath memory layer 315 and the additional memory layer. Is such cases, word line driver 305 and bit line driver 310 may be configured to access memory devices on both memory layer 315 and the additional memory layer—e.g., through vias that extend through memory layer 315 and the additional memory layer. Also, memory devices located on the additional memory layer may have a greater electrical distance and/or physical distance relative to word line driver 305 and/or bit line driver 310 than memory devices located on memory layer 315. The above concepts may be extended to memory structures including more than two memory layers (e.g., 3 or 4 memory layers).

Figure 4:
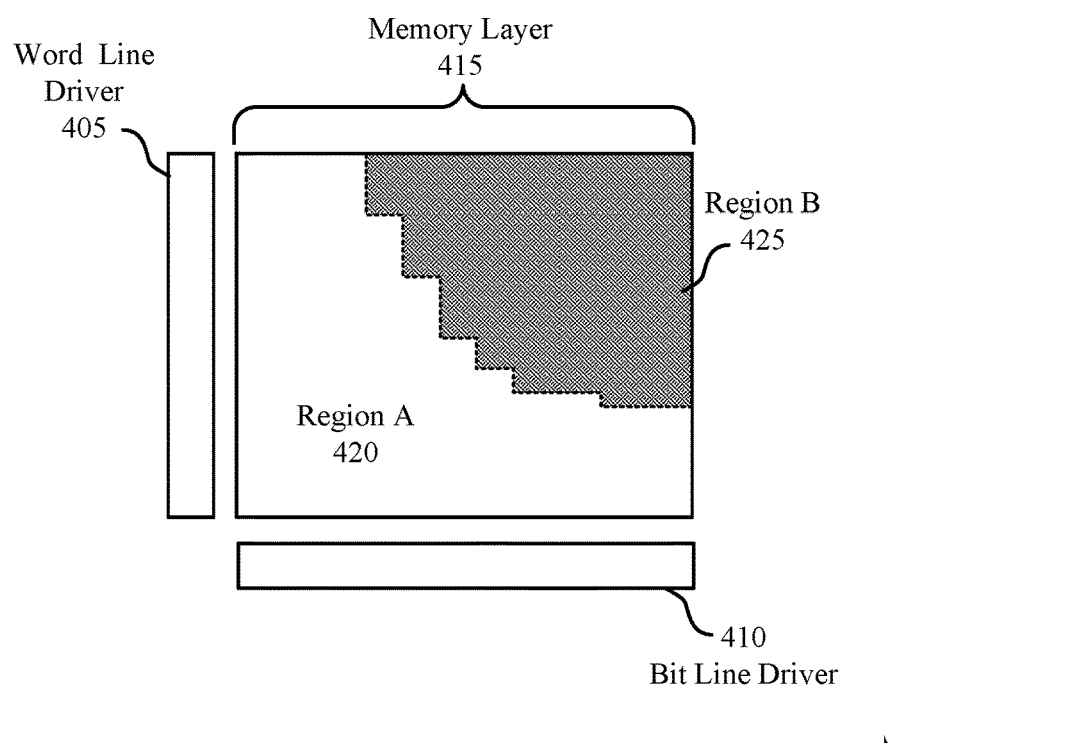

FIG. 4 illustrates an example of a memory structure that supports graded memory stack resistances as disclosed herein. Memory structure 400 may be an example of memory structure 300 of FIG. 3. Memory structure 400 may include word line driver 405, bit line driver 410, and memory layer 415, which may be respective examples of word line driver 305, bit line driver 310, and memory layer 315 of FIG. 3. In some examples, memory structure 400 may include multiple memory layers, word line drivers, and/or bit line drivers, where different memory layers, word line drivers, and/or bit line drivers may be configured differently than on other memory layers.

Memory layer 415 may include first region 420 and second region 425. First region 420 may include a first set of memory devices having first electrical distances and/or effective resistances relative to word line driver 405 and/or bit line driver 410. The memory devices within first region 420 ("first memory devices") may also have a first resistance based on a memory stack configuration, as discussed in more detail herein and at least with reference to FIGS. 5 and 6.

Second region 425 may include a second set of memory devices having second electrical distances and/or effective resistances relative to word line driver 405 and/or bit line driver 410, where the second electrical distances and/or effective resistances may be greater than the first electrical distances and/or effective resistances, respectively. The memory devices within second region 425 ("second memory devices") may also have a second resistance that is less than the first resistance based on a memory stack configuration, as discussed in more detail herein and at least with reference to FIGS. 5 and 6.

In some examples, the boundary between first region 420 and second region 425 may be associated with a threshold physical distance from word line driver 405 and/or bit line driver 410. For example, at least some if not all of the memory devices within or equal to the physical distance may be included in first region 420 and all of the memory devise outside the physical distance may be included in second region 425.

In some examples, the boundary between first region 420 and second region 425 may be associated with a threshold electrical distance. That is, all the memory devices having an electrical distance lower than the threshold electrical distance (e.g., the first memory devices having the first electrical distances) may be located in first region 420 and all of the memory devices having an electrical distance higher than the threshold electrical distance (e.g., the second memory devices having the second electrical distances) may be located in second region 425. Using a threshold electrical distance to separate memory cells may result in a jagged boundary between first region 420 and second region 425, as depicted in FIG. 4.

In some examples, the threshold electrical distance and/or the threshold physical distance may be chosen based on a distribution of a voltage (e.g., a modelled distribution of a simulated voltage) related to memory layer 415 or an observed or measured distribution of an actual voltage throughout an actual memory layer that is similar to memory layer 415. For example, the threshold electrical distance or physical distance may be chosen based on determining that a component of the simulated or actual voltage is above or below a threshold voltage at a particular electrical or physical distance.

In some examples, a value for the second resistance of the second memory devices may be selected based on the voltage distribution across memory layer 415. For example, the second resistance may be selected to be smaller than the first resistance of the first memory devices to increase a voltage applied across the second memory devices to a certain level or to bring a distribution of a voltage applied across memory layer 415 within a certain range—e.g., the distribution of voltages applied throughout memory layer 415 may be tightened as the voltage applied at the second memory devices is increased to be closer to the voltage applied at the first memory devices.

In other examples, a value for the first resistance of the first memory devices may be selected based on the voltage distribution related to memory layer 415. For example, the first resistance may be selected to be larger than the second resistance of the second memory devices to decrease a voltage applied across the first memory devices to a certain level or to bring a distribution of a voltage applied across memory layer 415 within a certain range.

After identifying the threshold electrical distance, the first resistance for the first memory devices, and/or the second resistance for the second memory devices, the first memory devices in first region 420 may be formed on or assembled on memory layer 415 to have first resistances and the second memory devices in second region 425 may be formed on or assembled on memory layer 415 to have second resistances.

In some examples, forming the first memory devices and second memory devices to have different resistances includes preventing the deposition of a resistive layer in first region 420 or second region 425. In some examples, forming the first memory devices and second memory devices to have different resistances includes removing a resistive layer from first region 420 and/or second region 425. In some examples, forming the first memory devices and second memory devices to have different resistances includes removing a portion of a first conductive layer from first region 420 or second region 425 and depositing a second conductive layer on the remaining portion of the first conductive layer, where the second conductive layer having a lower conductivity than the first conductive layer (or a "reduced conductivity" layer). In some examples, masks that cover a portion of memory layer 415 (e.g., first region 420) are used to enable the sole deposition or removal of a layer on another portion of memory layer 415 (e.g., second region 425).

FIG. 5 illustrates an example of memory stack configurations used in a memory array with graded memory stack resistances as disclosed herein. First memory stack 501 and second memory stack 502 may have different resistances.

First memory stack 501 may include first bit line 505, first resistive layer 510, first electrode layer 515, first storage device 520, second electrode layer 525, second resistive layer 530, and first word line 535. In some examples, first memory stack 501 may also include a selector device (e.g., between second resistive layer 530 and second electrode layer 525 or between first resistive layer 510 and first electrode layer 515).

First memory stack 501 may have a first resistance that may be based on a combined resistance of the different layers included in first memory stack 501. In some examples, the first resistance may include a first internal access resistance that may be based on a subset of the layers included in first memory stack 501 and a first internal storage resistance that may be based on first storage device 520. The first internal access resistance may include a combined resistance of first bit line 505, first resistive layer 510, first electrode layer 515, second electrode layer 525, second resistive layer 530, and first word line 535 in some examples. In some examples, the first internal access resistance may exclude the resistances of first bit line 505 and first word line 535. As discussed herein, the magnitude of the first internal access resistance may vary slightly with changes related to (e.g. the temperature of) the first memory stack 501 throughout the operational life of first memory stack 501. In some examples, the first internal storage resistance may include the resistance of first storage device 520, and in some examples, a resistance of a selector device that is included in first memory stack 501. As discussed herein, the magnitude of the first internal storage resistance may vary more significantly than the first internal access resistance throughout the operational life of first memory stack 501 based on a logic state of first storage device 520, among other reasons.

In some examples, the first resistance of first memory stack 501 may be measured after first memory stack 501 is formed and before the memory component including first memory stack 501 is tested or operated—e.g., before any information is stored at first storage device 520. In other cases, the first resistance of first memory stack 501 may be measured after first memory stack 501 is formed and based on first storage device 520 being configured in a first state—e.g., based on first storage device 520 being in one of an amorphous or crystalline state as a result of the formation process. In some examples, the first resistance of first memory stack 501 may be measured after first memory stack 501 is formed and while a memory component including first memory stack 501 is in a powered-down/off state—e.g., if the logic states of memory stacks in the memory component are reset to/return to a default state when power is lost.

In other cases, the first resistance of first memory stack 501 is measured and may change more significantly throughout the operational life of first memory stack 501—e.g., based on a logic state of first storage device 520, the temperature of first memory stack 501, aging and use of first memory stack 501. Similarly, the first internal storage resistance of first memory stack 501 may vary significantly (e.g., more significantly) throughout the operational life of first memory stack 501—e.g., based on a logic state of first storage device 520. By contrast, the first internal access resistance of first memory stack 501 may remain relatively constant from when first memory stack 501 is formed and through the operational life of first memory stack 501—e.g., varying to some degree based on temperature, age, and use of first memory stack 501, among other possibilities.

In some examples, first memory stack 501 may be an example, or representation of, a memory device located in first region 420 of FIG. 4. In some examples, each memory device located in first region 420 of FIG. 4 may be constructed according to the configuration of first memory stack 501. Thus, memory stacks in first region 420 may include two resistive layers, which may mitigate (e.g., attenuate) the effects of a voltage spike at memory stacks in first region 420. In some examples, throughout the operational life of the memory structure 400 of FIG. 4, the first internal access resistance of each memory device in first region 420 may be greater than or equal to a first threshold resistance—e.g., despite minor variations in the first internal access resistance that occur over the operational life of memory structure 400.

First bit line 505 may be used to access first storage device 520—e.g., by applying a voltage to first bit line 505. In some examples, first bit line 505 may be composed of a conductive material such as tungsten (W).

First resistive layer 510 may be used to improve the operation of a memory device by improving reset current and mitigating read disturbances. First resistive layer 510 may be located below and in contact with first bit line 505. First resistive layer 510 may be composed of a resistive material such as tungsten-silicon-nitride (WSiN).

First electrode layer 515 may be used for accessing first storage device 520. First electrode layer 515 may be located below and in contact with first resistive layer 510. First electrode layer 515 may be composed of carbon (C) and may be more conductive than first resistive layer 510.

First storage device 520 may be programmable to be in one of multiple states and used to store information. First storage device 520 may be located below and in contact with first electrode layer 515. In some examples, first storage device 520 is a self-selecting storage component. In some examples, first storage device 520 may include a chalcogenide material, a ferroelectric material, a capacitive material, or a resistive material. In some examples, first storage device 520 may be associated with any storage technology or material that may be capable of storing information/accessible in a cross-point memory array.

Second electrode layer 525 may be used for accessing first storage device 520. Second electrode layer 525 may be located below and in contact with first storage device 520. Second electrode layer 525 may be composed of carbon (C) and may be more conductive than first resistive layer 510 and second resistive layer 530.

Second resistive layer 530 may be used to improve the operation of a memory device by improving reset current and mitigating read disturbances. Second resistive layer 530 may be located below and in contact with second electrode layer 525. Second resistive layer 530 may be composed of a resistive material such as tungsten-silicon-nitride (WSiN).

First word line 535 may be used to access first storage device 520—e.g., by applying a voltage to first word line 535. In some examples, first word line 535 is composed of a conductive material such as tungsten (W).

Second memory stack 502 may include second bit line 550, third resistive layer 555, third electrode layer 560, second storage device 565, fourth electrode layer 570, and second word line 575. In some examples, second memory stack 502 may also include a selector device (e.g., between second word line 575 and fourth electrode layer 570 or between third resistive layer 555 and third electrode layer 560).

Second memory stack 502 may have a second resistance that is based on a combined resistance of the different layers included in second memory stack 502. In some examples, the second resistance includes a second internal access resistance that is based on a subset of the layers included in second memory stack 502 and a second internal storage resistance that is based on second storage device 565. The second internal access resistance may include a combined resistance of second bit line 550, third resistive layer 555, third electrode layer 560, fourth electrode layer 570, and second word line 575. In some examples, the second internal access resistance may exclude the resistances of second bit line 550 and second word line 575. As discussed herein, the magnitude of the second internal access resistance may vary slightly with changes in one or more conditions or aspects, such as the temperature, associated with the second memory stack 502 throughout the operational life of second memory stack 502. In some examples, the second internal storage resistance may include the resistance of second storage device 565, and in some examples, a resistance of a selector device that is included in second memory stack 502. As discussed herein, the magnitude of the second internal storage resistance may vary more significantly than the second internal access resistance based on a logic state of second storage device 565 throughout the operational life of second memory stack 502.

In some examples, the second resistance of second memory stack 502 is measured after second memory stack 502 is formed and before the memory component including second memory stack 502 is tested or operated—e.g., before any information is stored at second storage device 565. In other cases, the second resistance of second memory stack 502 is measured after second memory stack 502 is formed based on second storage device 565 being configured in a first state—e.g., based on second storage device 565 being in one of an amorphous or crystalline state as a result of the formation process. In some examples, the second resistance of second memory stack 502 may be measured after second memory stack 502 is formed and while a memory component including first memory stack 502 is in a powered-down/off state—e.g., if the logic states of memory stacks in the memory component are reset/return to a default logic state when power is lost.

In other cases, the second resistance of second memory stack 502 may change significantly throughout the operational life of second memory stack 502—e.g., based on a logic state of second storage device 565, the temperature of second memory stack 502, aging and use of second memory stack 502, etc. Similarly, the second internal storage resistance of second memory stack 502 may vary more significantly throughout the operational life of second memory stack 502—e.g., based on a logic state of first storage device 520. By contrast, the second internal access resistance of second memory stack 502 may remain relatively constant from when second memory stack 502 is formed and through the operational life of second memory stack 502—e.g., varying gradually based on temperature, age, and use of second memory stack 502.

After manufacturing and before operation of a memory component including first memory stack 501 and second memory stack 502, the second resistance of second memory stack 502 may be less than the first resistance of first memory stack 501 due to the absence of an additional resistive layer in second memory stack 502. Similarly, throughout the operational life of the memory component including first memory stack 501 and second memory stack 502, the second internal access resistance of second memory stack 502 may be less than the first internal access resistance of first memory stack 501.

In some examples, second memory stack 502 may be an example, or representation of, a memory device located in second region 425 of FIG. 4. In some examples, at least some if not each memory device located in second region 425 of FIG. 4 may be constructed according to the configuration of second memory stack 502. Thus, memory stacks in the second region may include one resistive layer, which may increase the effects of a voltage spike at memory stacks in the second region. As suggested above, the current delivery and cross-tile performance of second memory stack 502 may be improved by omitting a resistive layer between second word line 575 and fourth electrode layer 570—i.e., by decreasing a resistance of second memory stack 502 relative to first memory stack 501. In some examples, throughout the operational life of the memory structure 400 of FIG. 4, the second internal access resistance of each memory device in second region 425 may be less than the first threshold resistance discussed with respect to memory stacks in first region 420—e.g., despite minor variations in the second internal access resistance that occur over the operational life of memory structure 400.

Second bit line 550 may be used to access second storage device 565—e.g., by applying a voltage to second bit line 550. In some examples, second bit line 550 may be composed of a conductive material such as tungsten (W). In some examples, second bit line 550 may be electrically connected to first bit line 505—i.e., second bit line 550 and first bit line 505 may be a part of a same bit line.

Third resistive layer 555 may be used to improve the operation of a memory device by improving reset current and mitigating read disturbances. Third resistive layer 555 may be located below and in contact with second bit line 550. Third resistive layer 555 may be composed of a resistive material such as tungsten-silicon-nitride (WSiN). In some examples, third resistive layer 555 may be deposited concurrently with and as a part of the deposition same layer as first resistive layer 510.

Third electrode layer 560 may be used for accessing second storage device 565. Third electrode layer 560 may be located below and in contact with third resistive layer 555. In some examples, third electrode layer 560 may be composed of carbon (C) and may be more conductive than third resistive layer 555. In some examples, third electrode layer 560 may be deposited concurrently with and as a part of the same deposition layer as first electrode layer 515.

Second storage device 565 may be programmable to be in one of multiple states and used to store information. Second storage device 565 may be located below and in contact with third electrode layer 560. In some examples, second storage device 565 may be a self-selecting storage component. In some examples, second storage device 565 may include a chalcogenide material, a ferroelectric material, a capacitive material, or a resistive material. In some examples, second storage device 565 is associated with any storage technology or material that is capable of storing information/accessible in a cross-point memory array. In some examples, the material of second storage device 565 may be deposited concurrently with and as a part of the same deposition layer as the material of first storage device 520.

Fourth electrode layer 570 may be used for accessing second storage device 565. Fourth electrode layer 570 may be located below and in contact with second storage device 565. Fourth electrode layer 570 may be composed of carbon (C) and may be more conductive than third resistive layer 555. In some examples, fourth electrode layer 570 may be deposited concurrently with and as a part of the same deposition layer as second electrode layer 525.

Second word line 575 may be used to access second storage device 565—e.g., by applying a voltage to second word line 575. In some examples, second word line 575 may be electrically connected to first word line 535—i.e., second word line 575 and first word line 535 may be a part of the same word line. In some examples, second word line 575 is composed of a conductive material such as tungsten (W).

In some examples, second memory stack 502 is configured such that third resistive layer 555 is positioned between second word line 575 and fourth electrode layer 570 and such that second bit line 550 is in direct contact with third electrode layer 560—i.e., there is not a resistive layer between second bit line 550 and third electrode layer 560.

In some examples, memory devices within first region 420 of FIG. 4 are formed based on the configuration of first memory stack 501 and memory devices within second region 425 of FIG. 4 are formed based on the configuration of second memory stack 502. In some examples, first memory stack 501 and second memory stack 502 are formed concurrently on a memory layer, such as memory layer 415 of FIG. 4. In some examples, a mask may be used to cover a portion of the memory layer including second memory stack 502 while second resistive layer 530 is deposited on first word line 535 to avoid depositing a resistive layer on second word line 575.

FIG. 6 illustrates an example of memory stack configurations that support graded memory stack resistances as disclosed herein. First memory stack 601 and second memory stack 602 may have different resistances.

First memory stack 601 may include first bit line 605, first resistive layer 610, first storage device 630, third electrode layer 635, second resistive layer 640, and first word line 645, which may be respective examples of first bit line 505, first resistive layer 510, first storage device 520, second electrode layer 525, second resistive layer 530, and first word line 535 of FIG. 5. First memory stack 601 may include an electrode bi-layer 615. In some examples, first memory stack 601 may also include a selector device (e.g., between second resistive layer 640 and third electrode layer 635 or between first resistive layer 610 and electrode bi-layer 615).

First memory stack 601 may have a first resistance that may be based on a combined resistance of the different layers included in first memory stack 601. In some examples, the first resistance may include a first internal access resistance and a first internal storage resistance, as similarly discussed with reference to FIG. 5. That is, the first internal access resistance may be defined to omit the resistance of components whose resistance varies significantly throughout the operating life of first memory stack 601 (e.g., the resistance of first storage device 630).

In some examples, the first resistance of first memory stack 601 is measured after first memory stack 601 is formed and before the memory component including first memory stack 601 is operated. In other cases, the first resistance of first memory stack 601 is measured after first memory stack 601 is formed and based on first storage device 630 being configured in a first state—e.g., as a result of the formation process. In other cases, the first resistance of first memory stack 601 is measured and changes significantly throughout the operational life of first memory stack 601—e.g., based on a logic state of first storage device 630, the temperature of first memory stack 601, aging and use of first memory stack 601, etc.

In some examples, first memory stack 601 may be an example, or representation of, a memory device located in first region 420 of FIG. 4. In some examples, each memory device located in first region 420 of FIG. 4 may be constructed according to the configuration of first memory stack 601. Thus, memory stacks in first region 420 may include a reduced conductivity electrode bi-layer, which may mitigate the effect of voltage spikes at memory stacks in first region 420—i.e., by increasing the resistivity of the memory stacks. In some examples, throughout the operational life of the memory structure 400 of FIG. 4, the first internal access resistance of each memory device in first region 420 may be greater than or equal to a first threshold resistance—e.g., despite minor variations in the first internal access resistance that occur over the operational life of memory structure 400.

Electrode bi-layer 615 may include first electrode layer 620 and second electrode layer 625. First electrode layer 620 may be less conductive than second electrode layer 625 and may be used to decrease the conductivity, or increase the resistivity, of electrode bi-layer 615 relative to the conductivity, or resistivity, of second electrode layer 625. In some examples, a height of electrode bi-layer 615 may be equivalent to a height of fourth electrode layer 660, and thus, a height of first memory stack 601 may be equivalent to second memory stack 602.

Second memory stack 602 may include second bit line 650, third resistive layer 655, fourth electrode layer 660, second storage device 665, fifth electrode layer 670, fourth resistive layer 675, and second word line 680, which may be respective examples of second bit line 550, third resistive layer 555, third electrode layer 560, second storage device 565, fourth electrode layer 570, and second word line 575 of FIG. 5. In some examples, second memory stack 602 may also include a selector device (e.g., between fourth resistive layer 675 and fifth electrode layer 670 or between third resistive layer 655 and fourth electrode layer 660).

Second memory stack 602 may have a second resistance that is based on a combined resistance of the different layers included in second memory stack 602. In some examples, the second resistance may include a second internal access resistance and a second internal storage resistance, as similarly discussed with reference to FIG. 5. That is, the second internal access resistance may be defined to omit the resistance of components whose resistance varies significantly throughout the operating life of second memory stack 602 (e.g., the resistance of second storage device 665). After manufacturing and before operation of a memory component including first memory stack 601 and second memory stack 602—or based on second storage device 665 being configured in the same state as first storage device 630—the second resistance of second memory stack 602 may be less than the first resistance of first memory stack 601 due to the increased conductivity of fourth electrode layer 660 relative to the conductivity of electrode bi-layer 615. Also, throughout the operational life of the memory component including first memory stack 601 and second memory stack 602, the second internal access resistance of second memory stack 602 may be less than the first internal access resistance of first memory stack 601.

In some examples, memory devices within first region 420 of FIG. 4 are formed based on the configuration of first memory stack 601 and memory devices within second region 425 of FIG. 4 are formed based on the configuration of second memory stack 602. As discussed herein, by increasing the resistance of first memory stacks in the first region relative to memory stacks in the second region, the cross-tile performance of a memory layer may be improved by more evenly distributing the effects of voltage spikes throughout the memory layer. In some examples, throughout the operational life of the memory structure 400 of FIG. 4, the second internal access resistance of each memory device in second region 425 may be less than the first threshold resistance discussed with respect to memory stacks in first region 420—e.g., despite minor variations in the second internal access resistance that occur over the operational life of memory structure 400.

In some examples, first memory stack 601 and second memory stack 602 are formed concurrently on a memory layer, such as memory layer 415 of FIG. 4. In some examples, after the deposition of an electrode layer that includes fourth electrode layer 660 on a memory layer, a mask may be used to cover second memory stack 602 while a portion of the electrode layer may be removed to form second electrode layer 625. After the portion of the electrode layer is removed, the same mask or a second mask may be used to cover second memory stack 602 while another electrode layer that includes first electrode layer 620 may be deposited on the remaining portion of the electrode layer—e.g., on second electrode layer 625.

Figure 7:
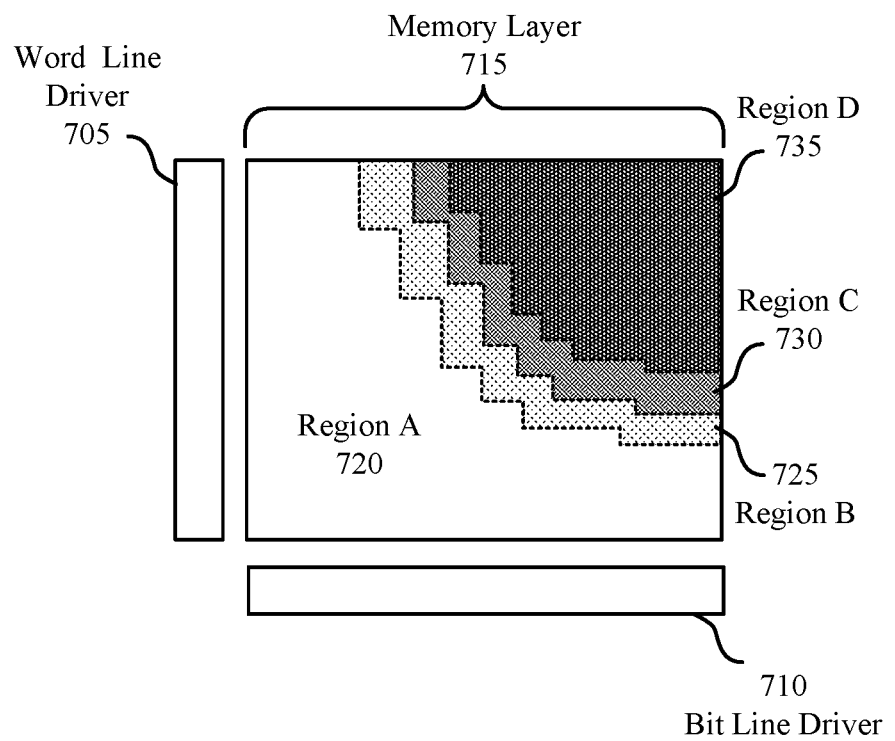
FIG. 7 illustrates an example of a memory structure that supports graded memory stack resistances as disclosed herein.

FIG. 7 illustrates an example of a memory structure that supports graded memory stack resistances as disclosed herein. Memory structure 700 may be an example of memory structure 300 or memory structure 400, as described with reference to FIGS. 3 and 4. Memory structure 700 may include word line driver 705, bit line driver 710, and memory layer 715, which may be respective examples of word line driver 305 or word line driver 405, bit line driver 310 or bit line driver 410, and memory layer 315 or memory layer 415, as described with reference to FIGS. 3 and 4. In some examples, memory structure 700 may include multiple memory layers, word line drivers, and/or bit line drivers, where different memory layers, word line drivers, and/or bit line drivers may be configured differently than on other memory layers.

Memory layer 715 may include first region 720, second region 725, third region 730, and fourth region 735. First region 720 may include a first set of memory devices having first electrical distances and/or effective resistances relative to word line driver 705 and/or bit line driver 710. The memory devices within first region 720 ("first memory devices") may also have a first resistance based on a memory stack configuration, as discussed in more detail herein and at least with reference to FIG. 8.

Second region 725 may include a second set of memory devices having second electrical distances and/or effective resistances relative to word line driver 705 and/or bit line driver 710, where the second electrical distances and/or effective resistances are greater than the first electrical distances and/or effective resistances, respectively. The memory devices within second region 725 ("second memory devices") may also have a second resistance based on a memory stack configuration, as discussed in more detail herein and at least with reference to FIG. 8.

Third region 730 may include a third set of memory devices having second electrical distances and/or effective resistances relative to word line driver 705 and/or bit line driver 710, where the second electrical distances and/or effective resistances are greater than the first electrical distances and/or effective resistances, respectively. The memory devices within third region 730 ("third memory devices") may also have a third resistance based on a memory stack configuration, as discussed in more detail herein and at least with reference to FIG. 8.

Fourth region 735 may include a fourth set of memory devices having second electrical distances and/or effective resistances relative to word line driver 705 and/or bit line driver 710, where the second electrical distances and/or effective resistances are greater than the first electrical distances and/or effective resistances, respectively. The memory devices within fourth region 735 ("fourth memory devices") may also have a fourth resistance based on a memory stack configuration, as discussed in more detail herein and at least with reference to FIG. 8. In some examples, the fourth resistance may be less than the third resistance of the third memory devices, the third resistance may be less than the second resistance of the second memory devices, and the second resistance may be less than the first resistance of the first memory devices.

In some examples, the first boundary between first region 720 and second region 725 may be associated with a first threshold electrical distance; the second boundary between second region 725 and third region 730 may be associated with a second threshold electrical distance; and the third boundary between third region 730 and fourth region 735 may be associated with a third threshold electrical distance. That is, all the memory devices on memory layer 715 having an electrical distance lower than the first threshold electrical distance (e.g., first memory devices) may be located in first region 720. In some examples, all the memory devices on memory layer 715 having electrical distance lower than the second threshold electrical distance (e.g., second memory devices) may be located in second region 725.

In some examples, all the memory devices on memory layer 715 having electrical distance lower than the third threshold electrical distance (e.g., third memory devices) may be located in third region 730. And all the memory devices on memory layer 715 having electrical distance greater than the third threshold electrical distance (e.g., fourth memory devices) may be located in fourth region 735. Using threshold electrical distances to partition memory layer 715 into regions may result in jagged boundaries between the regions, as depicted in FIG. 4.

In some examples, partitioning memory layer 715 into additional regions (e.g., more than 2) enables the effects of a voltage spike to be more evenly distributed across memory layer 715. That is, by using more regions, the range of effects from voltage spikes to memory devices on memory layer 715 may be minimized.

Although four regions are depicted in FIG. 7, memory layer 715 may include more than four regions (e.g., from five to dozens of regions). In some examples, each region may be separated from the other region based on an electrical distance and/or effective resistance of memory devices within a respective region. In some examples, the regions including memory devices having higher electrical distances may also contain memory devices having higher standalone resistances than memory device contained in regions includes memory devices having lower electrical distances.

Figure 8:
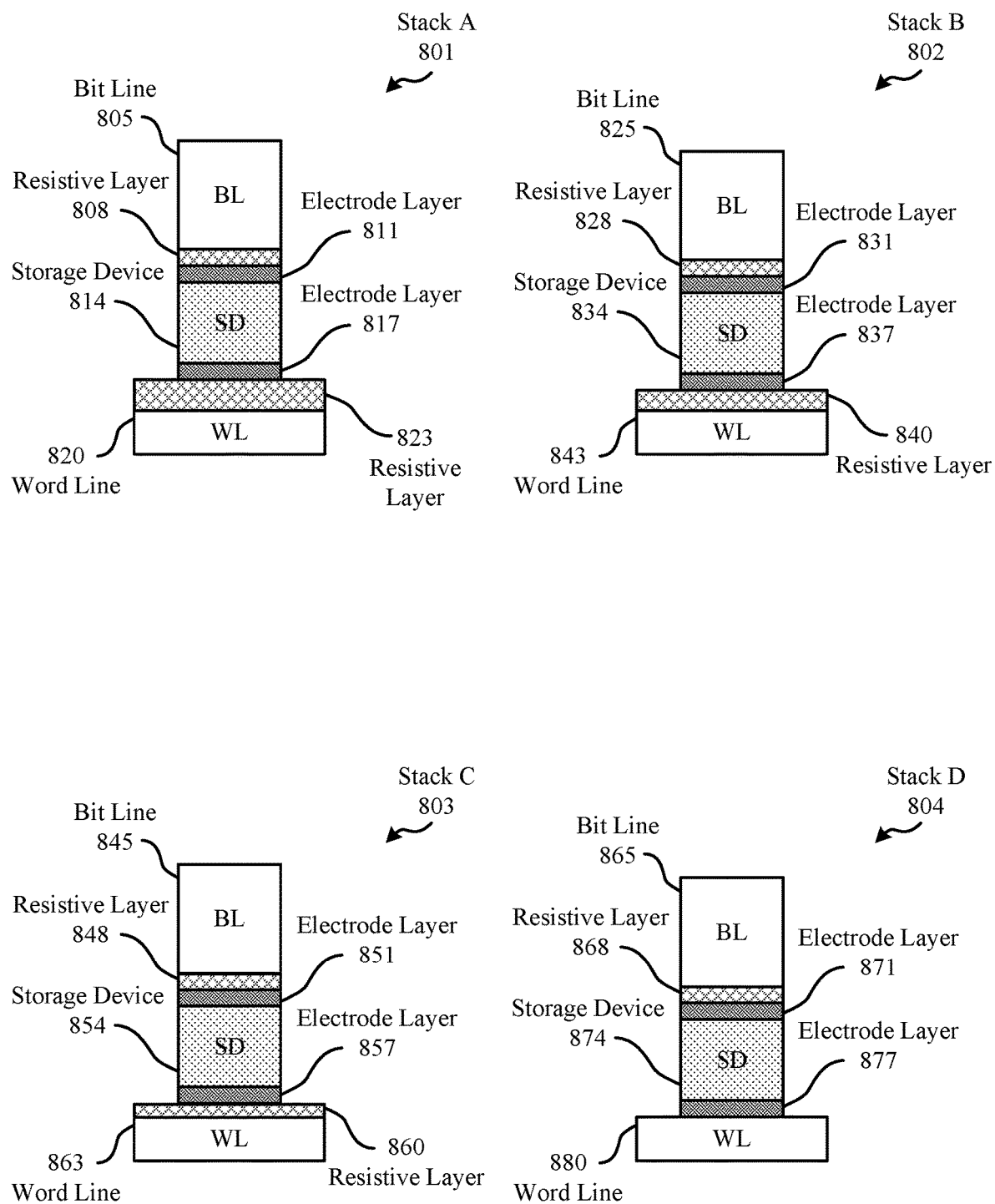
FIG. 8 illustrates an example of memory stack configurations used in a memory array with graded memory stack resistances as disclosed herein.

FIG. 8 illustrates an example of memory stack configurations used in a memory array with graded memory stack resistances as disclosed herein. First memory stack 801, second memory stack 802, third memory stack 803, and fourth memory stack 804 may have different resistances.

First memory stack 801 may be an example of first memory stack 501 of FIG. 5. First memory stack 801 may include first bit line 805, first resistive layer 808, first electrode layer 811, first storage device 814, second electrode layer 817, second resistive layer 823, and first word line 820, which may be examples of and/or similarly configured as first bit line 505, first resistive layer 510, first electrode layer 515, first storage device 520, second electrode layer 525, second resistive layer 530, and first word line 535 of FIG. 5. In some examples, first memory stack 801 may also include a selector device (e.g., between second resistive layer 823 and second electrode layer 817 or between first resistive layer 808 and first electrode layer 811).

First memory stack 801 may have a first resistance that may be based on a combined resistance of the different layers included in first memory stack 801. In some examples, the first resistance may include a first internal access resistance and a first internal storage resistance, as similarly discussed with reference to FIGS. 5 and 6. That is, the first internal access resistance may be defined to omit the resistance of components whose resistance varies significantly throughout the operating life of first memory stack 801 (e.g., the resistance of first storage device 814).

In some examples, the first resistance of first memory stack 801 may be measured after first memory stack 801 is formed and before the memory component including first memory stack 801 is operated. In other cases, the first resistance of first memory stack 801 may be measured after first memory stack 801 is formed and based on first storage device 814 being configured in a first state—e.g., as a result of the formation process. In other cases, the first resistance of first memory stack 801 may be measured and may change significantly throughout the operational life of first memory stack 801—e.g., based on a logic state of first storage device 814, the temperature of first memory stack 801, aging and use of first memory stack 801, etc.

In some examples, first memory stack 801 may be an example, or representation of, a memory device located in first region 720 of FIG. 7. In some examples, each memory device located in first region 720 of FIG. 7 may be constructed according to the configuration of first memory stack 801. Thus, memory stacks in first region 720 may include two resistive layers, decreasing the effects of a voltage spike at those memory stacks. In some examples, throughout the operational life of the memory structure 700 of FIG. 7, the first internal access resistance of each memory device in first region 720 may be greater than or equal to a first threshold resistance—e.g., despite minor variations in the first internal access resistance that occur over the operational life of memory structure 400.

Second memory stack 802 may include second bit line 825, third resistive layer 828, third electrode layer 831, second storage device 834, fourth electrode layer 837, fourth resistive layer 840, and second word line 843, which may be examples of and/or similarly configured as first bit line 505, first resistive layer 510, first electrode layer 515, first storage device 520, second electrode layer 525, second resistive layer 530, and first word line 535 of FIG. 5. In some examples, second memory stack 802 may also include a selector device (e.g., between fourth resistive layer 840 and fourth electrode layer 837 or between third resistive layer 828 and third electrode layer 831).

Second memory stack 802 may have a second resistance that is less than the first resistance of first memory stack 801 due to a decreased thickness of fourth resistive layer 840 relative to second resistive layer 823. In some examples, the second resistance may include a second internal access resistance and a second internal storage resistance, as similarly discussed with reference to FIGS. 5 and 6. After manufacturing and before operation of a memory component including first memory stack 801 and second memory stack 802—or based on second storage device 834 being configured in the same state as first storage device 814—the second resistance of second memory stack 802 may be less than the first resistance of first memory stack 801 due to the decreased thickness of fourth resistive layer 840 relative to second resistive layer 823. Similarly, throughout the operational life of the memory component including first memory stack 801 and second memory stack 802, the second internal access resistance of second memory stack 802 may be less than the first internal access resistance of first memory stack 801.

In some examples, second memory stack 802 may be an example, or representation of, a memory device located in second region 725 of FIG. 7. In some examples, each memory device located in second region 725 of FIG. 7 may be constructed according to the configuration of second memory stack 802. Thus, memory stacks in second region 725 may include a first resistive layer and a thinner resistive layer than memory stacks in first region 720 (e.g., two-thirds of the second resistive layer 823), increasing the effects of a voltage spike at memory stack in the second region 725. For at least the reasons discussed herein, the current delivery and cross-tile performance of second memory stack 802 may be improved by decreasing a thickness of fourth resistive layer 840—i.e., by decreasing a resistance of second memory stack 802 relative to first memory stack 801. In some examples, throughout the operational life of the memory structure 700 of FIG. 7, the second internal access resistance of each memory device in second region 725 may be less than the first threshold resistance discussed with respect to memory stacks in first region 720 and greater than a second threshold resistance—e.g., despite minor variations in the second internal access resistance that occur over the operational life of memory structure 700.

Third memory stack 803 may include third bit line 845, fifth resistive layer 848, fifth electrode layer 851, third storage device 854, sixth electrode layer 857, sixth resistive layer 860, and third word line 863, which may be examples of and/or similarly configured as first bit line 505, first resistive layer 510, first electrode layer 515, first storage device 520, second electrode layer 525, second resistive layer 530, and first word line 535 of FIG. 5. In some examples, third memory stack 803 may also include a selector device (e.g., between sixth resistive layer 860 and sixth electrode layer 857 or between fifth resistive layer 848 and fifth electrode layer 851).

Third memory stack 803 may have a third resistance that may be less than the second resistance of second memory stack 802 due to a decreased thickness of sixth resistive layer 860 relative to fourth resistive layer 840. In some examples, the third resistance may include a third internal access resistance and a third internal storage resistance, as similarly discussed with reference to FIGS. 5 and 6. After manufacturing and before operation of a memory component including first memory stack 801, second memory stack 802, and third memory stack 803—or based on third storage device 854 being configured in the same state as first storage device 814 and second storage device 834—the third resistance of third memory stack 803 may be less than the first resistance of first memory stack 801 and the second resistance of second memory stack 802 due to the decreased thickness of sixth resistive layer 860 relative to fourth resistive layer 840 and second resistive layer 823. Similarly, throughout the operational life of the memory component including first memory stack 801, second memory stack 802, and third memory stack 803, the third internal access resistance of third memory stack 803 may be less than the first internal access resistance of first memory stack 801 and second internal access resistance of second memory stack 802.

In some examples, third memory stack 803 may be an example, or representation of, a memory device located in third region 730 of FIG. 7. In some examples, each memory device located in third region 730 of FIG. 7 may be constructed according to the configuration of third memory stack 803. Thus, memory stacks in third region 730 may include a first resistive layer and a thinner resistive layer than memory stacks in first region 720 or second region 725 (e.g., the resistive layer of memory stacks in third region 730 may be one-third of the second resistive layer 823), increasing the effects of a voltage spike at memory stacks in third region 730. For at least the reasons discussed herein, the current delivery and cross-tile performance of third memory stack 803 may be improved by decreasing a thickness of sixth resistive layer 860—i.e., by decreasing a resistance of third memory stack 803 relative to first memory stack 801 and second memory stack 802. In some examples, throughout the operational life of the memory structure 700 of FIG. 7, the third internal access resistance of each memory device in third region 730 may be less than the first and second threshold resistances discussed with respect to memory stacks in first region 720 and second region 725 and greater than a third threshold resistance—e.g., despite minor variations in the third internal access resistance that occur over the operational life of memory structure 700.

Fourth memory stack 804 may include fourth bit line 865, seventh resistive layer 868, seventh electrode layer 871, fourth storage device 874, eighth electrode layer 877, and fourth word line 880, which may be examples of and/or similarly configured as first bit line 505, first resistive layer 510, first electrode layer 515, first storage device 520, second electrode layer 525, and first word line 535 of FIG. 5. In some examples, fourth memory stack 804 may also include a selector device (e.g., between fourth word line 880 and eighth electrode layer 877 or between seventh resistive layer 868 and seventh electrode layer 871).

Fourth memory stack 804 may have a fourth resistance that may be less than the third resistance of third memory stack 803 due to an absence of a resistive layer between fourth word line 880 and eighth electrode layer 877. In some examples, the fourth resistance may include a fourth internal access resistance and a fourth internal storage resistance, as similarly discussed with reference to FIGS. 5 and 6. After manufacturing and before operation of a memory component including first memory stack 801, second memory stack 802, third memory stack 803, and fourth memory stack 804—or based on fourth storage device 874 being configured in the same state as first storage device 814, second storage device 834, and third storage device 854—the fourth resistance of fourth memory stack 804 may be less than the first, second, and third resistances of first memory stack 801, second memory stack 802, and third memory stack 803 due to the absence of a second resistive layer in fourth memory stack 804. Similarly, throughout the operational life of the memory component including first memory stack 801, second memory stack 802, third memory stack 803, and fourth memory stack 804, the fourth internal access resistance of fourth memory stack 804 may be less than the first, second, and third internal access resistances of first memory stack 801, second memory stack 802, and third memory stack 803.

In some examples, fourth memory stack 804 may be an example, or representation of, a memory device located in fourth region 735 of FIG. 7. In some examples, each memory device located in fourth region 735 of FIG. 7 may be constructed according to the configuration of fourth memory stack 804. Thus, memory stacks in third region 730 may include one less resistive layer than memory stacks in first region 720, second region 725, and third region, increasing the effects of a voltage spike at memory stacks in fourth region 735. For at least the reasons discussed herein, the current delivery and cross-tile performance of fourth memory stack 804 may be improved by removing a resistive layer from between fourth word line 880 and eighth electrode layer 877—i.e., by decreasing a resistance of fourth memory stack 804 relative to first memory stack 801, second memory stack 802, and third memory stack 803. In some examples, throughout the operational life of the memory structure 700 of FIG. 7, the fourth internal access resistance of each memory device in fourth region 735 may be less than the first, second, and third threshold resistances discussed with respect to memory stacks in first region 720, second region 725, and third region 730 and greater than a fourth threshold resistance—e.g., despite minor variations in the fourth internal access resistance that occur over the operational life of memory structure 700.

In some examples, first memory stack 801, second memory stack 802, third memory stack 803, and fourth memory stack 804 are formed concurrently. For example, to form first word line 820, second word line 843, third word line 863, and fourth word line 880, a first conductive material may be deposited on a memory layer. To form second resistive layer 823, fourth resistive layer 840, and sixth resistive layer 860: (1) a first resistive material may be deposited on the memory layer, forming second resistive layer 823; (2) a mask may be placed over first memory stack 801 and second memory stack 802; (3) a first portion of the first resistive material may be removed, forming sixth resistive layer 860; (4) a mask may be placed over first memory stack 801 and third memory stack 803; and (5) a second portion, smaller than the first portion, of the first resistive material may be removed, forming fourth resistive layer 840 and removing (e.g., completely removing) the deposited resistive material from fourth memory stack 804. Thus, fourth memory stack 804 may include one resistive layer, increasing the effects of a voltage spike at fourth memory stack 804.

After selectively removing the resistive material from the memory stacks, a first electrode material may be disposed on top of the remaining material; a storage device material may be disposed on top of the first electrode material; a second electrode material may be disposed on top of the storage device material; a second resistive material may be disposed on top of the second electrode material; and a second conductive material may be disposed on top of the second resistive material.

In another example of forming second resistive layer 823, fourth resistive layer 840, and sixth resistive layer 860: (1) a first resistive material of a first thickness may be deposited on the memory layer; (2) a mask may be placed over first memory stack 801, second memory stack 802, and third memory stack 803; (3) a first portion (e.g., a third) of the resistive material may be removed (e.g., by etching) from fourth memory stack 804; (4) the portion of the mask covering third memory stack 803 may be removed (e.g., by trimming); (5) a portion (e.g., a third) of the resistive material may be removed from third memory stack 803 and an additional portion (e.g., another third) of the resistive material may be removed from fourth memory stack 804; (6) the portion of the mask covering second memory stack 802 may be removed (e.g., by trimming); (7) and a portion (e.g., a third) of the resistive material may be removed from second memory stack 802 and additional portions (e.g., another third) of the resistive material may be removed from third memory stack 803 and fourth memory stack 804; and (8) the remaining portion of the mask covering first memory stack 801 may be removed.

Accordingly, second resistive layer 823 may be formed having the first thickness, fourth resistive layer 840 may be formed having two-thirds the first thickness; sixth resistive layer 860 may be formed having one-third the first thickness, and all or almost all of the resistive material may be removed from fourth memory stack 804. This process for forming memory stacks having resistive layers of different thicknesses may be extended to form more than four memory stacks with varying resistances—e.g., by reducing the portion of resistive material removed by each etching step.

Figure 9:
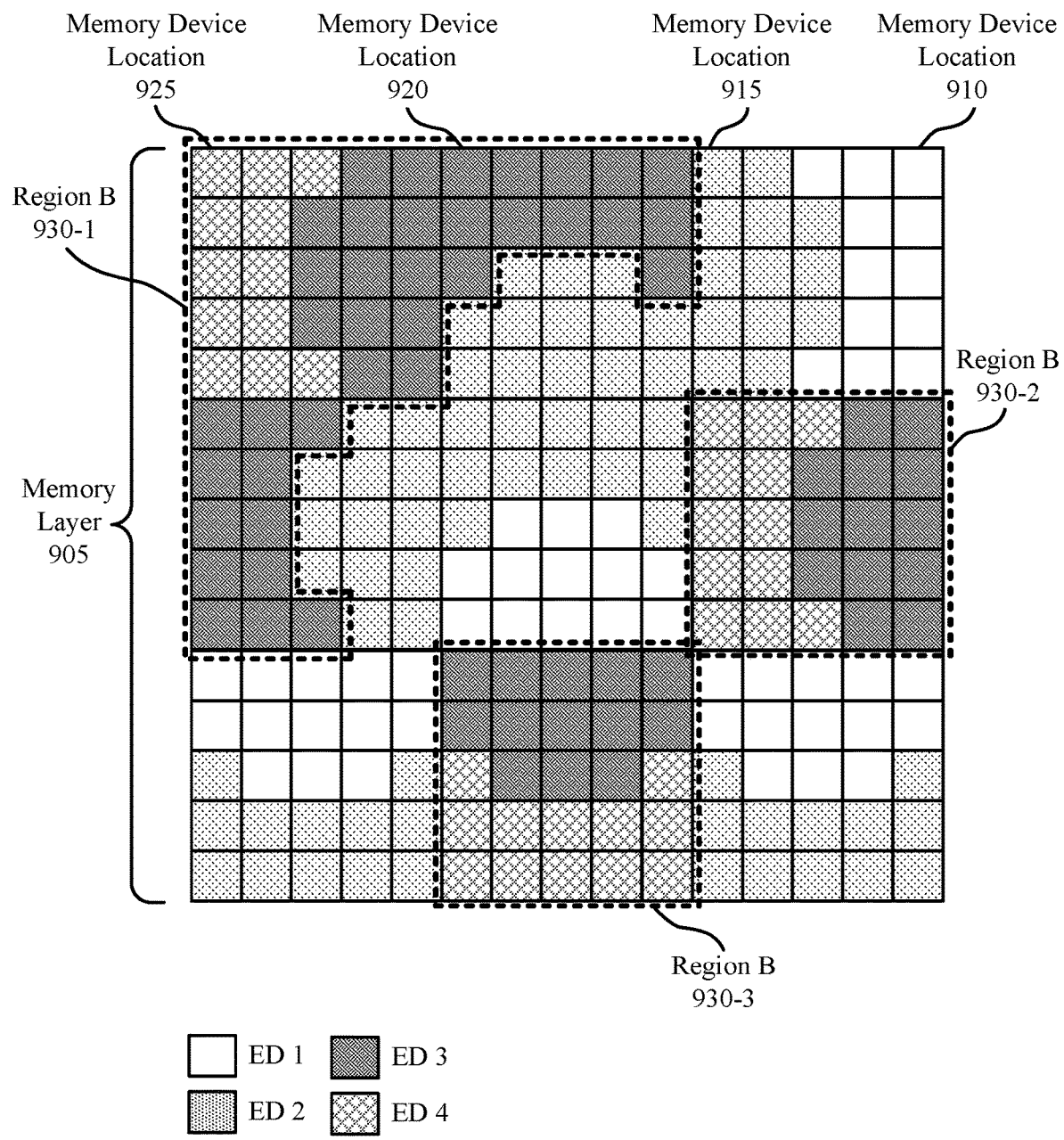
FIG. 9 illustrates an example of a memory structure that supports graded memory stack resistances as disclosed herein.

FIG. 9 illustrates an example of a memory structure that supports graded memory stack resistances as disclosed herein. Memory structure 900 may include memory layer 905.

Memory layer 905 may be an example of memory layer 315, memory layer 415, or memory layer 715, as discussed with reference to FIGS. 3, 4, and 7. Memory layer 905 may include memory device locations, such as first memory device location 910, second memory device location 915, third memory device location 920, and fourth memory device location 925—in some examples, each memory device location may support one or more memory devices. Each memory device location may be associated with a corresponding electrical distance relative to circuitry for accessing the memory device (e.g., a word line driver or bit line driver). For example, first memory device location 910 may have a first electrical distance, second memory device location 915 may have a second electrical distance, third memory device location 920 may have a third electrical distance, and fourth memory device location 925 may have a fourth electrical distance.

In some examples, memory locations having electrical distances below a first electrical distance threshold (e.g., first memory device location 910) may be characterized as ED1 memory device locations; memory locations having electrical distances above the first electrical distance threshold and below a second electrical distance threshold (e.g., second memory device location 915) may be characterized as ED2 memory device locations; memory locations having electrical distances above the second electrical distance threshold and below a third electrical distance threshold (e.g., third memory device location 920) may be characterized as ED3 memory device locations; and memory device locations having electrical distances above the third electrical distance threshold and below a fourth electrical distance threshold (e.g., fourth memory device location 925) may be characterized as ED4 memory device locations.

As discussed herein, memory locations—and thus, memory devices within memory device locations—may be grouped together based on their electrical distance. That is, memory device locations having electrical distances below or between threshold electrical distances may be grouped together. Thus, memory layer 905 may also include a first region and second region 930. The first region may include all of the memory locations not encompassed by second region 930 and may be an example of first region 420 or first region 720, as discussed with reference to FIGS. 4 and 7. Second region 930 may be an example of second region 425 or second region 725, as discussed with reference to FIGS. 4 and 7. For example, memory device locations having electrical distances above a second electrical distance threshold, such as third memory device location 920 and fourth memory device location 925 may be grouped together, as represented by second region 930.

Unlike the memory layers discussed in FIGS. 3 and 4, memory device locations on memory layer 905 having a same electrical distance may not be concentrated in a contiguous region but may be dispersed throughout memory layer 905 in a non-contiguous fashion (e.g., a separated fashion). That is, one memory device location having a first electrical distance may be located in a top right corner of memory layer 905 while another memory device location having a first electrical distance may be located in a bottom right corner of memory layer 905. Also, the memory device locations may be separated from one another or other locations or elements by additional memory device locations having different (e.g., higher and/or lower) electrical distance. Thus, a region including memory device locations of a particular electrical distance(s) may be noncontiguous.

In some examples, this noncontiguous configuration is a result of a word line driver and bit line driver for accessing memory layer 905 being located underneath memory layer 905. In such cases, the word line driver and bit line driver may access memory devices located on memory layer 905 using one or more vias that extend through memory layer 905. In some examples, based on the locations of the vias, the access paths to certain memory devices (e.g., memory devices located near the vias) may be more direct than for other memory devices, which may result in the noncontiguous distribution of electrical distances across memory layer 905.

For example, second region 930—which may encompass memory device locations having electrical distances larger than or equal to a second electrical distance threshold—may be separated into three non-contiguous regions: first subregion 930-1, second subregion 930-2, and third subregion 930-3. In some examples, the memory device locations not included within second region 930 may be characterized as being included in a first region (or Region A). In some examples, the memory device locations may be separated into more than two regions, in accordance with the discussion above.

In some examples, memory layer 905 may include additional device memory locations and additional regions (e.g., at least a third region and a fourth region). In some examples, the additional memory device locations may be associated with higher electrical distances (e.g., ED5 to ED9) and additional regions may encompass the additional memory device locations (e.g., a third region may encompass ED5 to ED7 memory device locations and a fourth region may encompass ED8 to ED9 memory device locations).

After identifying which memory device locations are included in which regions, memory devices may be formed on memory layer 905. As discussed herein, the memory devices may be formed such that a resistance of memory devices having electrical distances above a threshold (e.g., i.e., memory devices in second region 930) may be less than a resistance of memory devices having electrical distances below the threshold—e.g., memory devices in fourth memory device location 925 and third memory device location 920 may have resistances that are less than a resistance of memory devices in second memory device location 915 and first memory device location 910.

In some examples, the memory devices may be similar to the memory stacks discussed in FIGS. 5, 6, and/or 8. For example, memory devices in first memory device location 910 and second memory device location 915 may be constructed according to the configuration of first memory stack 501 of FIG. 5 or first memory stack 601 of FIG. 6, and memory devices in third memory device location 920 and fourth memory device location 925 may be constructed according to the configuration of second memory stack 502 of FIG. 5 or second memory stack 602 of FIG. 6.

Forming memory layer 905 may include using masks to cover portions of memory layer 905 while resistive layers are selectively removed or added from uncovered portions of memory layer 905. An example process for forming memory layer 905 may include (1) depositing a conductive material (e.g., tungsten) for a word line layer on memory layer 905; (2) depositing a resistive material (e.g., WSiN) on top of the word line layer; (3) covering the portions of memory layer 905 outside of second region 930; (4) removing the resistive material from the uncovered portions of memory layer 905 (i.e., second region 930); (5) depositing a material (e.g., a chalcogenide material) for a storage device on top of the entire memory layer 905; and (6) forming any remaining memory layers. Accordingly, memory devices in second region 930 may have one less resistive layer and a decreased resistance relative to memory devices than memory devices outside of second region 930.

In some examples, removing the resistive material from second region 930 includes removing the resistive material from via areas within second region 930. In other cases, the resistive layer over via areas within second region 930 is not removed—e.g., by covering the via areas during the removal step.

In another example, a process for forming memory layer 905 may include (1) depositing a material for an electrode layer on top of a storage device layer; (2) covering the second region 930 of memory layer 905; (3) removing a portion of the electrode layer from the uncovered region of memory layer 905; (4) depositing a reduced-conductivity layer on top of the uncovered region of memory layer 905; (5) depositing a resistive layer on top of the entire memory layer 905; and (6) forming any remaining material layers. Accordingly, memory devices not located in second region 930 may have a reduced-conductivity electrode bi-layer and an increased resistance relative to memory devices located in second region 930.

As discussed herein, memory structure 900 may include multiple memory layers, including memory layer 905. In some examples, one or more memory layers are configured differently than other memory layers. Also, in some examples, the selective removal or addition of resistive layers may be performed for some memory layers but not others. In some examples, memory devices located on upper memory layers have higher electrical distances and/or physical distances relative to a word line driver and/or bit line driver—which may be located underneath the memory layers and used to access memory devices on one or more of the memory layers.

Figure 10:
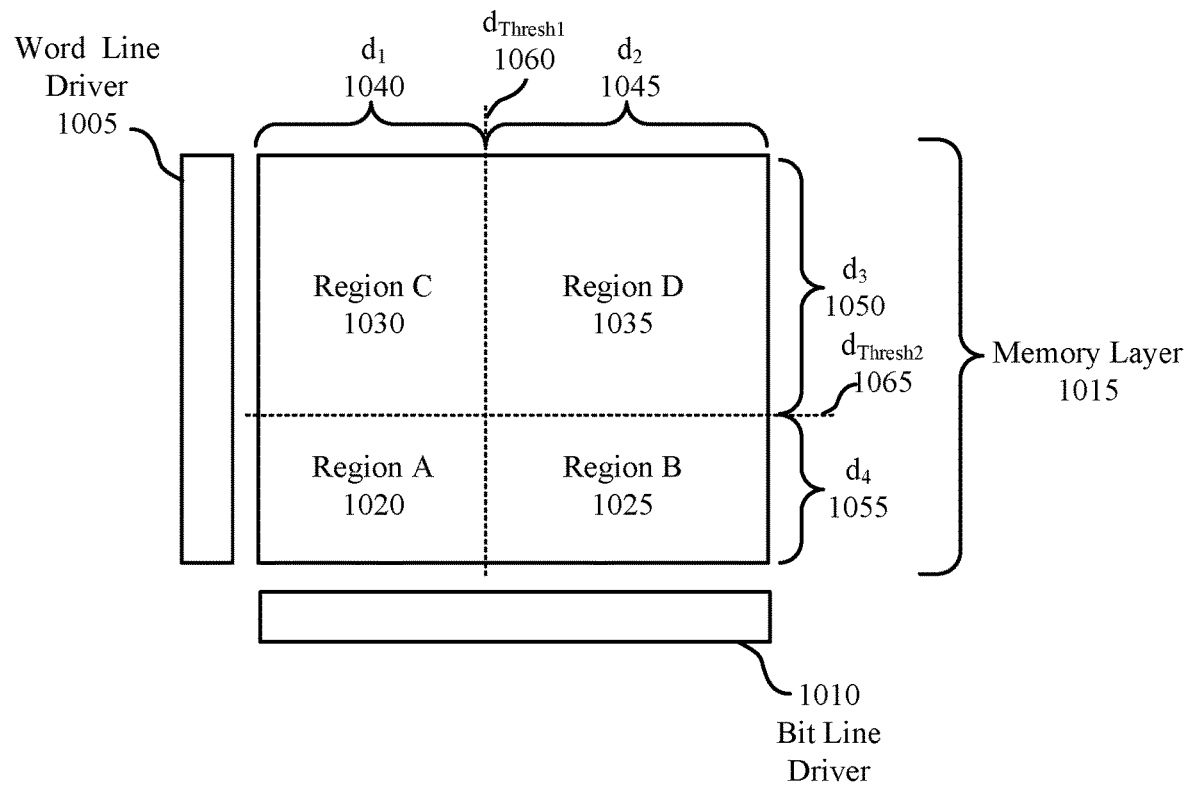
FIG. 10 illustrates an example of a memory structure that supports graded memory stack resistances as disclosed herein.

FIG. 10 illustrates an example of a memory structure that supports graded memory stack resistances as disclosed herein. Memory structure 1000 may be an example of memory structure 300, memory structure 400, memory structure 700, or memory structure 900 of FIG. 3, 4, 7, or 9. Memory structure 1000 may include word line driver 1005, bit line driver 1010, and memory layer 1015, which may be respective examples of word line driver 305, word line driver 405, or word line driver 705; bit line driver 310, bit line driver 410, or bit line driver 710; or memory layer 315, memory layer 415, memory layer 715, or memory layer 905 of FIG. 3, 4, 7, or 9.

Memory layer 1015 may be partitioned into first region 1020, second region 1025, third region 1030, and fourth region 1035. First region 1020 may horizontally extend from word line driver 1005 for first distance 1040 and vertically extend from bit line driver for fourth distance 1055. Second region 1025 may horizontally extend from an end of first region 1020 for second distance 1045 and vertically extend from bit line driver for fourth distance 1055. Third region 1030 may horizontally extend from word line driver 1005 for first distance 1040 and vertically extend from an end of first region 1020 for third distance 1050. Fourth region 1035 may horizontally extend from an end of third region 1030 for second distance 1045 and vertically extend from an end of second region 1025 for third distance 1050. In some examples, first distance 1040 is smaller than second distance 1045 and third distance 1050 is larger than fourth distance 1055. In some examples, memory layer 1015 may be partitioned into more than four regions (e.g., from five to dozens of regions).

As discussed herein, an electrical distance of memory devices and/or locations on memory layer 1015 may be closely tied to a physical location of those memory devices and/or locations relative to decoding circuitry, such as word line driver 1005 and bit line driver 1010. For example, a majority of memory devices in first region 1020 may have smaller electrical distances than memory devices located in the remaining regions; a majority of memory devices in second region 1025 and third region 1030 may have larger electrical distances than memory devices located in first region 1020 and smaller electrical distances than memory devices located in fourth region 1035, and a majority of memory devices in fourth region 1035 may have large electrical distances than memory devices located in the remaining regions.

Accordingly, the goal of forming memory devices with larger electrical distances to have lower resistances than memory devices with smaller electrical distances may be achieved by the partitioning of memory layer 1015 based on physical distances from word line driver 1005 and/or bit line driver 1010. That is, memory devices located in first region 1020 (i.e., memory devices having smaller electrical distances) may be formed to have a higher resistance than memory device located in the remaining regions. Memory devices located in second region 1025 and third region 1030 (i.e., memory devices having intermediate electrical distances) may be formed to have a lower resistance than memory devices located in first region 1020 and a higher resistance than memory devices located in fourth region 1035.

In some examples, memory devices located in second region 1025 and third region 1030 have a same resistance. In other cases, memory devices located in second region 1025 and third region 1030 having different resistances—e.g., if increased effects of a voltage spike are experienced in second region 1025 relative to third region 1030. And memory devices located in fourth region 1035 may be formed to have a lower resistance than memory devices located in the remaining regions.

In some examples, first threshold distance 1060 and second threshold distance 1065 are determined based on modelled or observed voltage spike effects. In some examples, values for first threshold distance 1060 and second threshold distance 1065 may be selected to minimize the range of voltage spike effects experienced across memory layer 1015. In some examples, values for first threshold distance 1060 and second threshold distance 1065 may be selected based on determining that a voltage level at a certain location on memory layer 1015 resulting from a voltage spike may be below a certain threshold. After determining the threshold distances, first distance 1040 may be selected to be less than or equal to first threshold distance 1060 and fourth distance 1055 may be selected to be less than or equal to second threshold distance 1065.

Figure 11:
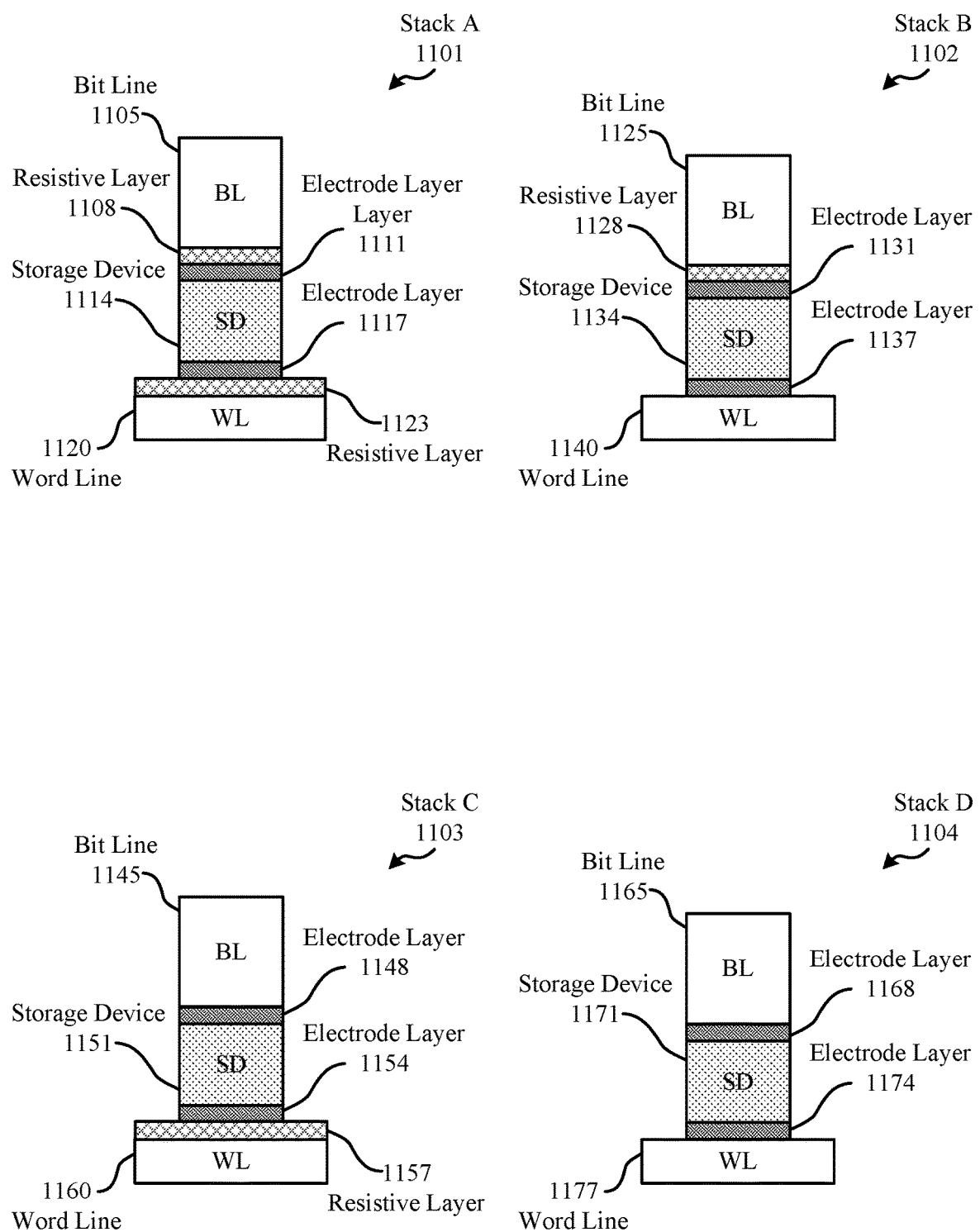
FIG. 11 illustrates an example of memory stack configurations used in a memory array with graded memory stack resistances as disclosed herein.

FIG. 11 illustrates an example of memory stack used in a memory array with graded memory stack resistances as disclosed herein. First memory stack 1101, second memory stack 1102, third memory stack 1103, and fourth memory stack 1104 may have different resistances.

First memory stack 1101 may be an example of first memory stack 501 of FIG. 5. First memory stack 1101 may include first bit line 1105, first resistive layer 1108, first electrode layer 1111, first storage device 1114, second electrode layer 1117, second resistive layer 1123, and first word line 1120, which may be examples of and/or similarly configured as first bit line 505, first resistive layer 510, first electrode layer 515, first storage device 520, second electrode layer 525, second resistive layer 530, and first word line 535 of FIG. 5. In some examples, first memory stack 1101 may also include a selector device.

First memory stack 1101 may have a first resistance that may be based on a combined resistance of the layers included in first memory stack 1101. In some examples, the first resistance may include a first internal access resistance and a first internal storage resistance, as similarly discussed with reference to FIGS. 5, 6, and 8. That is, the first internal access resistance may be defined to omit the resistance of components whose resistance varies significantly throughout the operating life of first memory stack 1101 (e.g., the resistance of first storage device 1114).

In some examples, the first resistance of first memory stack 1101 is measured after first memory stack 1101 is formed and before the memory component including first memory stack 1101 is operated. In other cases, the first resistance of first memory stack 1101 is measured after first memory stack 1101 is formed and based on first storage device 1114 being configured in a first state—e.g., based on first storage device 1114 being in an amorphous or crystalline state. In other cases, the first resistance of first memory stack 1101 is measured and changes significantly throughout the operational life of first memory stack 1101—e.g., based on a logic state of first storage device 1114, the temperature of first memory stack 1101, aging and use of first memory stack 1101, etc.

In some examples, first memory stack 1101 may be an example, or representation of, a memory device located in first region 1020 of FIG. 10. In some examples, each memory device located in first region 1020 of FIG. 10 may be constructed according to the configuration of first memory stack 1101. Thus, memory stacks in first region 1020 may include two resistive layers, attenuating the effects of a voltage spike at those memory stacks. In some examples, throughout the operational life of the memory structure 1000 of FIG. 10, the first internal access resistance of each memory device in first region 1020 may be greater than or equal to a first threshold resistance—e.g., despite minor variations in the first internal access resistance that occur over the operational life of memory structure 1000.

Second memory stack 1102 may be an example of second memory stack 502 of FIG. 5. Second memory stack 1102 may include second bit line 1125, third resistive layer 1128, third electrode layer 1131, second storage device 1134, fourth electrode layer 1137, and second word line 1140, which may be examples of and/or similarly configured as second bit line 550, third resistive layer 555, third electrode layer 560, second storage device 565, fourth electrode layer 570, and second word line 575 of FIG. 5. In some examples, second memory stack 1102 may also include a selector device.

Second memory stack 1102 may have a second resistance that is less than the first resistance of first memory stack 1101 due to the absence of a second resistive layer between second word line 1140 and fourth electrode layer 1137. In some examples, the second resistance may include a second internal access resistance and a second internal storage resistance, as similarly discussed with reference to FIGS. 5, 6, and 8. After manufacturing and before operation of a memory component including first memory stack 1101 and second memory stack 1102—or based on second storage device 1134 being configured in the same state as first storage device 1114—the second resistance of second memory stack 1102 may be less than the first resistance of first memory stack 1101 due to the absence of the second resistive layer between second word line 1140 and fourth electrode layer 1137. Similarly, throughout the operational life of the memory component including first memory stack 1101 and second memory stack 1102, the second internal access resistance of second memory stack 1102 may be less than the first internal access resistance of first memory stack 1101.

In some examples, second memory stack 1102 may be an example, or representation of, a memory device located in second region 1025 of FIG. 10. In some examples, each memory device located in second region 1025 of FIG. 10 may be constructed according to the configuration of second memory stack 1102. Thus, memory stacks in second region 1025 may include one resistive layer, increasing the effects of a voltage spike at memory stacks in second region 1025 relative to if memory stacks in second region 1025 included two or more resistive layers. In some examples, each memory device located in third region 1030 of FIG. 10 may also be constructed according to the configuration of second memory stack 1102. For at least the reasons discussed herein, the current delivery and cross-tile performance of second memory stack 1102 may be improved by not including a second resistive layer in second memory stack 1102—i.e., by decreasing a resistance of second memory stack 1102 relative to first memory stack 1101. In some examples, throughout the operational life of the memory structure 1000 of FIG. 10, the second internal access resistance of each memory device in second region 1025 may be less than the first threshold resistance discussed with respect to memory stacks in first region 1020 and greater than a second threshold resistance—e.g., despite minor variations in the second internal access resistance that occur over the operational life of memory structure 1000.

Third memory stack 1103 may include third bit line 1145, fifth electrode layer 1148, third storage device 1151, sixth electrode layer 1154, fourth resistive layer 1157, and third word line 1160, which may be examples of and/or similarly configured as first bit line 505, first electrode layer 515, first storage device 520, second electrode layer 525, second resistive layer 530, and first word line 535 of FIG. 5. In some examples, third memory stack 1103 may also include a selector device.

Third memory stack 1103 may have a third resistance that is less than the first resistance of second memory stack 1102 due to the absence of a second resistive layer between third bit line 1145 and fifth electrode layer 1148. In some examples, the third resistance of third memory stack 1103 is the same as the second resistance of second memory stack 1102. In some examples, the third resistance may include a third internal access resistance and a third internal storage resistance, as similarly discussed with reference to FIGS. 5, 6, and 8. After manufacturing and before operation of a memory component including first memory stack 1101, second memory stack 1102, and third memory stack 1103—or based on third storage device 1151 being configured in the same state as first storage device 1114 and second storage device 1134—the third resistance of third memory stack 1103 may be less than the first resistance of first memory stack 1101 due to the absence of a second resistive layer between third bit line 1145 and fifth electrode layer 1148. Similarly, throughout the operational life of the memory component including first memory stack 1101, second memory stack 1102, and third memory stack 1103, the third internal access resistance of third memory stack 1103 may be less than the first internal access resistance of first memory stack 1101.

In some examples, third memory stack 1103 may be an example, or representation of, a memory device located in third region 1030 of FIG. 10. In some examples, each memory device located in third region 1030 of FIG. 10 may also be constructed according to the configuration of third memory stack 1103. Thus, memory stacks in third region 1030 may include one resistive layer, increasing the effects of a voltage spike at memory stacks in third region 1030 relative to if memory stacks in third region 1030 included two or more resistive layers. In some examples, each memory device located in second region 1025 of FIG. 10 may be constructed according to the configuration of third memory stack 1103. For at least the reasons discussed herein, the current delivery and cross-tile performance of third memory stack 1103 may be improved by not including a second resistive layer in third memory stack 1103—i.e., by decreasing a resistance of third memory stack 1103 relative to first memory stack 1101. In some examples, throughout the operational life of the memory structure 1000 of FIG. 10, the third internal access resistance of each memory device in third region 1030 may be less than the first and second threshold resistances discussed with respect to memory stacks in first region 1020 and second region 1025 and greater than a third threshold resistance—e.g., despite minor variations in the second internal access resistance that occur over the operational life of memory structure 1000.

Fourth memory stack 1104 may include fourth bit line 1165, seventh electrode layer 1168, fourth storage device 1171, eighth electrode layer 1174, and fourth word line 1177, which may be examples of and/or similarly configured as first bit line 505, first electrode layer 515, first storage device 520, second electrode layer 525, and first word line 535 of FIG. 5. In some examples, fourth memory stack 1104 may also include a selector device.

Fourth memory stack 1104 may have a fourth resistance that is less than the third resistance of second memory stack 1102 and third memory stack 1103 due to an absence of a resistive layer between fourth bit line 1165 and seventh electrode layer 1168 and between fourth word line 1177 and eighth electrode layer 1174. In some examples, the fourth resistance may include a fourth internal access resistance and a fourth internal storage resistance, as similarly discussed with reference to FIGS. 5, 6 and 8. After manufacturing and before operation of a memory component including first memory stack 1101, second memory stack 1102, third memory stack 1103, and fourth memory stack 1104—or based on fourth storage device 1171 being configured in the same state as first storage device 1114, second storage device 1134, and third storage device 1151—the fourth resistance of fourth memory stack 1104 may be less than the first, second, and third resistances of first memory stack

1101, second memory stack 1102, and third memory stack 1103—e.g., due to the absence of a resistive layer in fourth memory stack 1104. Similarly, throughout the operational life of the memory component including first memory stack 1101, second memory stack 1102, third memory stack 1103, and fourth memory stack 1104, the fourth internal access resistance of fourth memory stack 1104 may be less than the first, second, and third internal access resistances of first memory stack 1101, second memory stack 1102, and third memory stack 1103.

In some examples, fourth memory stack 1104 may be an example, or representation of, a memory device located in fourth region 1035 of FIG. 10 In some examples, each memory device located in fourth region 1035 of FIG. 10 may be constructed according to the configuration of fourth memory stack 1104. Thus, memory stacks in fourth region 1035 may not include any resistive layers, increasing the effects of a voltage spike at memory stacks in fourth region 1035 relative to if memory stack in fourth region 1035 included one or more resistive layers. For at least the reasons discussed herein, the current delivery and cross-tile performance of fourth memory stack 1104 may be improved by removing a resistive layer from between fourth word line 1177 and eighth electrode layer 1174—i.e., by decreasing a resistance of fourth memory stack 1104 relative to first memory stack 1101, second memory stack 1102, and third memory stack 1103. In some examples, throughout the operational life of the memory structure 1000 of FIG. 710, the fourth internal access resistance of each memory device in fourth region 1035 may be less than the first, second, and third threshold resistances discussed with respect to memory stacks in first region 1020, second region 1025, and third region 1030 and greater than a fourth threshold resistance—e.g., despite minor variations in the fourth internal access resistance that occur over the operational life of memory structure 1000.

Similar processes and techniques as discussed herein may be used to form the memory stacks discussed in FIG. 11. For example, one or more masks may be used to facilitate the selective removal of resistive material from the memory stacks.

Figure 12:
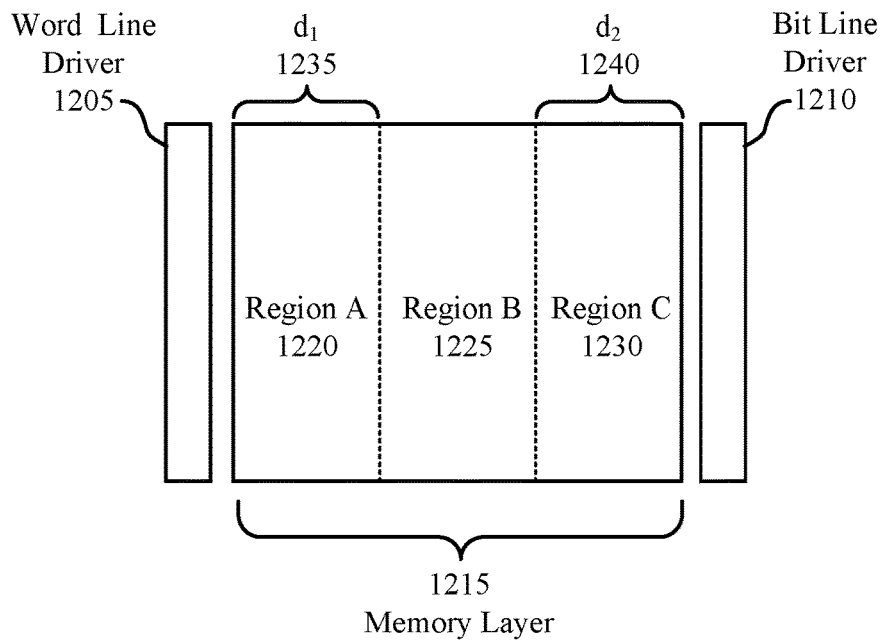
FIGS. 12 and 13 illustrate examples of memory structures that support graded memory stack resistances as disclosed herein.

FIG. 12 illustrates an example of a memory structure that supports graded memory stack resistances as disclosed herein. Memory structure 1200 may be an example of memory structure 300, memory structure 400, memory structure 700, memory structure 900, or memory structure 1000, as described with reference to FIG. 3, 4, 7, 9, or 10. Memory structure 1200 may include word line driver 1205, bit line driver 1210, and memory layer 1215, which may be respective examples of word line driver 305, word line driver 405, word line driver 705, or word line driver 1005; bit line driver 310, bit line driver 410, bit line driver 710, or bit line driver 1010; or memory layer 315, memory layer 415, memory layer 715, memory layer 905, or memory layer 1015, as described with reference to FIG. 3, 4, 7, 9, or 10. Memory structure 1200 may be similarly configured as memory structure 1000 of FIG. 10.

Memory layer 1215 may be partitioned into first region 1220, second region 1225, and third region 1230. First region 1220 may horizontally extend by first distance 1235 from word line driver 1205 in a first direction. Accordingly, first region 1220 may encompass all of the memory cells on memory layer 1215 that are within first distance 1235 from word line driver 1205. Third region 1230 may horizontally extend by second distance 1240 from bit line driver 1210 in a second direction opposite to the first direction. Accordingly, third region 1230 may encompass all of the memory cells on memory layer 1215 that are within second distance 1240 from bit line driver 1210. And second region 1225 may be located in between first region 1220 and third region 1230. Accordingly, second region 1225 may encompass all of the memory cells on memory layer 1215 not included in first region 1220 or third region 1230. In some examples, first distance 1235 may be different than second distance 1240 (e.g., larger or smaller). In some examples, memory layer 1015 may be partitioned into more than three regions (e.g., from four to dozens of regions).

In some examples, some quantity (e.g., a subset, a majority) of memory devices located in second region 1225 may be associated with larger electrical distances than memory devices located in first region 1220 and third region 1230. Also, For at least the reasons discussed herein, memory devices located in first region 1220 and third region 1230 may be formed to have a larger resistance than a resistance of memory devices located in second region 1225. In some examples, memory devices in first region 1220 and third region 1230 are constructed according to the configuration of first memory stack 501 of FIG. 5 and memory devices in second region 1225 are constructed according to the configuration of second memory stack 502 of FIG. 5. In other examples, memory devices in first region 1220 and third region 1230 are constructed according to the configuration of first memory stack 601 of FIG. 6 and memory devices in second region 1225 are constructed according to the configuration of second memory stack 602 of FIG. 6.

Figure 13:
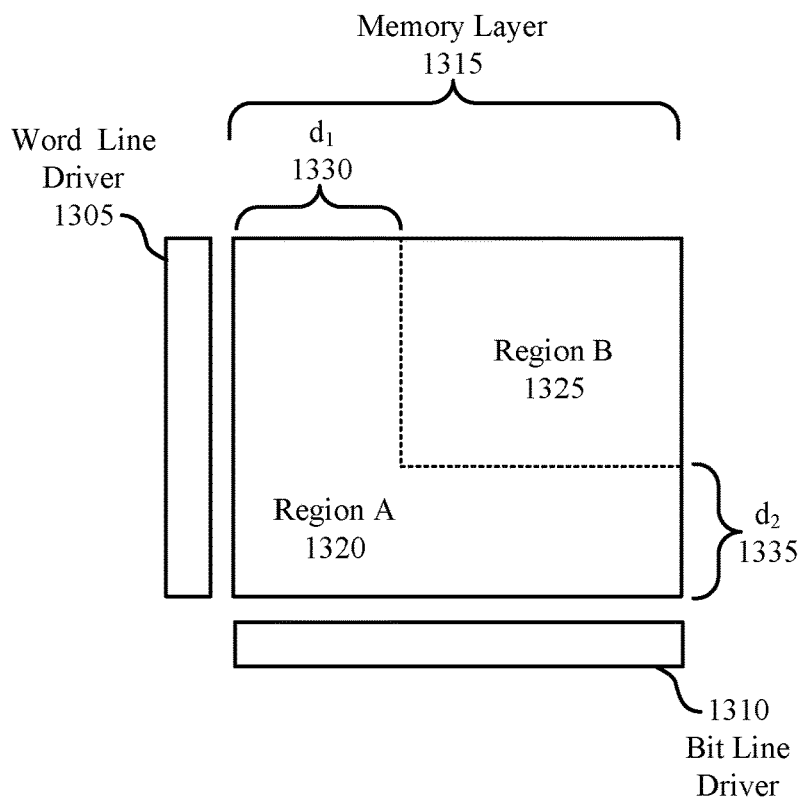

FIG. 13 illustrates an example of a memory structure that supports graded memory stack resistances as disclosed herein. Memory structure 1300 may be an example of memory structure 300, memory structure 400, memory structure 700, memory structure 900, memory structure 1000, or memory structure 1200, as described with reference to FIG. 3, 4, 7, 9, 10, or 12. Memory structure 1300 may include word line driver 1305, bit line driver 1310, and memory layer 1315, which may be respective examples of word line driver 305, word line driver 405, word line driver 705, word line driver 1005, or word line driver 1205; bit line driver 310, bit line driver 410, bit line driver 710, bit line driver 1010, or bit line driver 1210; or memory layer 315, memory layer 415, memory layer 715, memory layer 905, memory layer 1015, or memory layer 1215, as described with reference to FIG. 3, 4, 7, 9, or 10. Memory structure 1200 may be similarly configured as memory structure 1000 of FIG. 10 or memory structure 1200 of FIG. 12.

Memory layer 1315 may be partitioned into first region 1320 and second region 1325. First region 1320 may horizontally extend by first distance 1330 from word line driver 1305 in a first direction and vertically extend by second distance 1335 from bit line driver 1310 in a second direction, orthogonal to the first direction. Accordingly, first region 1320 may include all of the memory cells on memory layer 1315 that are within first distance 1330 from word line driver 1305 and all of the memory cells on memory layer 1315 that are within second distance 1335 from bit line driver 1310. Second region 1325 may be located in the remaining area of memory layer 1315. In some examples, first distance 1330 may be different than second distance 1335 (e.g., larger or smaller). In some examples, memory layer 1015 may be partitioned into more than two regions (e.g., from two to dozens of regions).

In some examples, a majority of memory devices located in second region 1325 may be associated with larger electrical distances than memory devices located in first region 1320. Also, For at least the reasons discussed herein, memory devices located in first region 1320 may be formed to have a larger resistance than a resistance of memory devices located in second region 1325. In some examples, memory devices in first region 1320 are constructed according to the configuration of first memory stack 501 of FIG. 5 and memory devices in second region 1325 are constructed according to the configuration of second memory stack 502 of FIG. 5. In other examples, memory devices in first region 1320 are constructed according to the configuration of first memory stack 601 of FIG. 6 and memory devices in second region 1325 are constructed according to the configuration of second memory stack 602 of FIG. 6.

Figure 14:
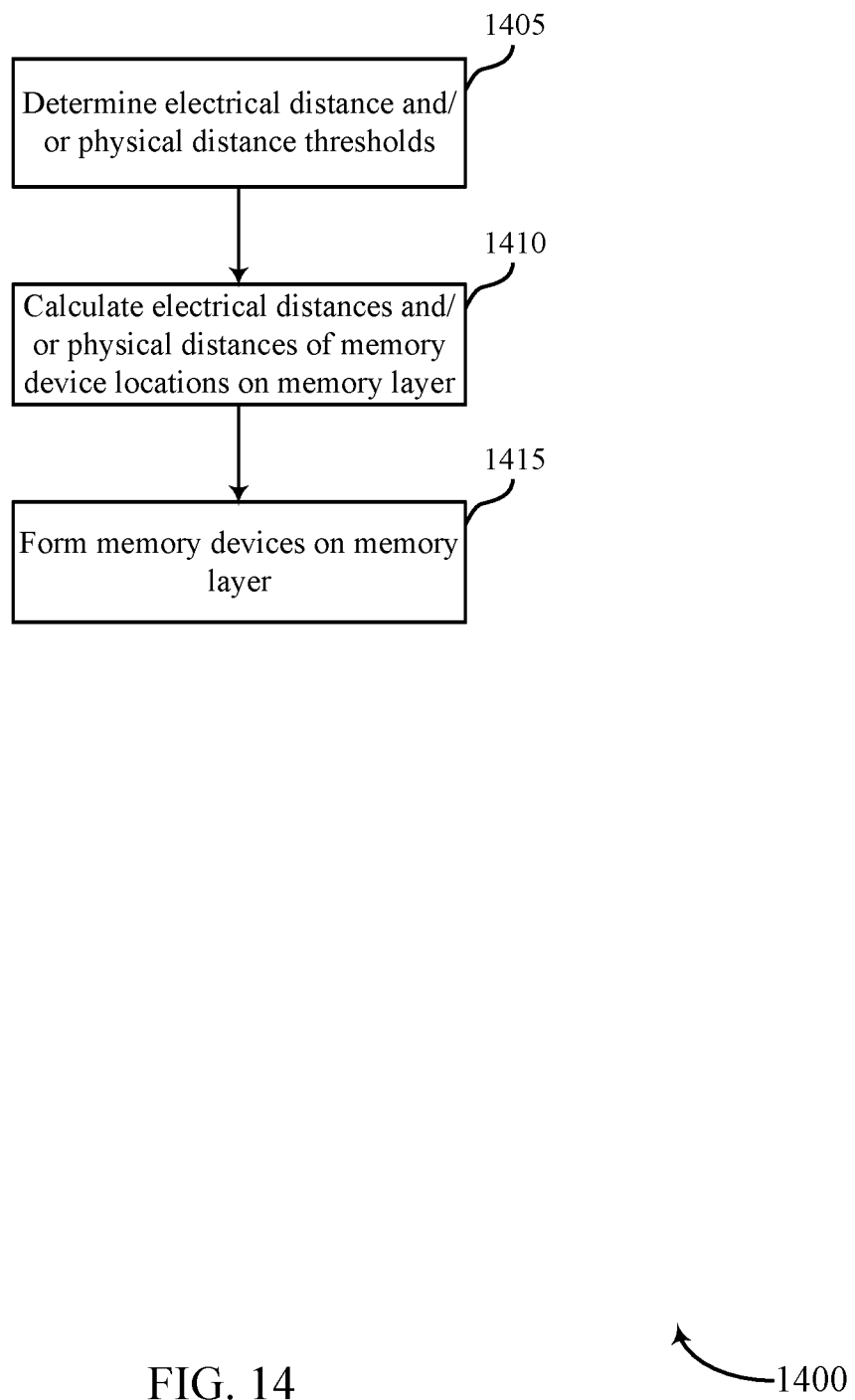
FIG. 14 illustrates aspects of a method for forming a memory array having graded memory stack resistances as disclosed herein.

FIG. 14 illustrates aspects of a method for forming a memory array having graded memory stack resistances as disclosed herein. Method 1400 describes steps and operations for forming a memory layer with graded memory stack resistances based on electrical distances and/or physical distances of memory device locations on the memory layer, as discussed with respect to FIGS. 3 to 13. The operations of method 1400 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

For method 1400, at block 1405, electrical distance threshold(s) and/or physical distance threshold(s) may be determined for a memory layer. In some examples, the electrical distance and/or physical distance threshold may be determined based on a modelled, calculated, or observed distribution of a voltage (including a contemporaneous voltage spike) applied by a word line driver and/or bit line driver throughout the memory layer or a similar memory layer. For example, the electrical distance and/or physical distance threshold may be determined based on identifying an electrical distance and/or physical distance where the magnitude of the distributed voltage falls below a threshold voltage level. In some examples, a first electrical and/or physical distance threshold from a word line driver may be determined and a second electrical and/or physical distance threshold from a bit line driver may be determined.

In some examples, the electrical distance and/or physical distance threshold or other thresholds may be determined based on other modelled, calculated, or observed characteristics a memory layer. For example, the electrical distance and/or physical distance threshold may be determined based on a modelled, calculated, or observed distribution of effective resistances across a memory layer. In such an example, the electrical distance and/or physical distance threshold may be determined based on identifying an electrical distance and/or physical distance where the effective resistance of a memory location exceeds a threshold resistance. In some examples, the threshold resistance may be determined based on a magnitude of a distributed voltage falling below a threshold voltage level. In other example, the electrical distance and/or physical distance threshold may be determined based on a modelled, calculated, or observed distribution of RC time constants across a memory layer. In such an example, the electrical distance and/or physical distance threshold may be determined based on identifying an electrical distance and/or physical distance where a resistor-capacitor (RC) time constant of a memory device location exceeds a threshold RC time constant. In some examples, the threshold RC time constant may be determined based on a magnitude of a distributed voltage falling below a threshold voltage level.

For method 1400, at block 1410, electrical distance and/or physical distances of physical memory device locations on a memory layer relative to a word line driver and/or bit line driver may be calculated. For example, an electrical distance of a memory device location may be determined by calculating (or measuring) a length of a conductive path between the memory device location and a word line and/or bit line driver. In some examples, a first calculated length of a first conductive path between the memory device location and the word line driver and a second calculated length of a second conductive path between the memory device location and the bit line driver may be combined to determine an electrical distance of the memory device location. In another example, a first physical distance between the memory device location and a word line driver and a second physical distance between the memory device location and a bit line driver may be calculated. In other examples, the first physical distance and the second physical distance may be combined to generate a third physical distance for the memory device location.

The calculated electrical and/or physical distances may be compared against respective electrical and/or physical distance thresholds. In some examples, memory device locations that have electrical and/or physical distances that are below a first electrical and/or physical distance threshold are grouped together to form a first region of the memory layer. In some examples, memory device locations that have electrical and/or physical distances that are above a first electrical and/or physical distance threshold and below a second electrical and/or physical distance threshold are grouped together to form a second region of the memory layer. And so on.

Similarly, effective resistances and/or RC time constants of particular memory device locations may be calculated relative to a word line driver and/or bit line driver. For example, an effective resistance and/or RC time constant of a memory device location may be determined by calculating a length of a conductive path between the memory device location and a word line and/or bit line driver. The calculated effective resistances and/or RC time constants may be compared against respective resistance and/or RC timing thresholds. And memory device locations that have effective resistances and/or RC time constants that are below a respective resistance and/or RC timing threshold may be grouped together to form a first region of the memory layer.

For method 1400, at block 1415, memory devices may be formed on memory layer at particular memory device locations based on the calculated electrical and/or physical distance of the memory device locations and the determined electrical and/or physical distance thresholds. For example, as discussed herein, memory devices located in a first region (e.g., low ED or near memory devices) may be formed to have a higher standalone and/or internal access resistance than memory devices located in a second region (e.g., high ED or far memory devices). The deposition of material may be accomplished any combination of CVD, MOCVD, PVD, sputter deposition, ALD, or MBE. The removal of material may be accomplished by any combination of chemical etching (also referred to as "wet etching"), plasma etching (also referred to as "dry etching"), or chemical mechanical planarization.

In some examples, first memory devices (e.g., low ED or near memory devices) located in a first region may be formed to have a higher standalone and/or internal access resistance relative to second memory devices (e.g., high ED or far memory devices) located in a second region by adding one or more additional resistive layers in the first memory devices.

In some examples, first memory devices (e.g., low ED or near memory devices) located in a first region may be formed to have a higher standalone and/or internal access resistance relative to second memory devices (e.g., high ED or far memory devices) located in a second region by increasing a resistivity of one or more memory layers of the first memory devices. Such a forming process may include first depositing a layer of conductive material (e.g., tungsten (W)) to form a word line layer. Next, depositing a resistive material (e.g., tungsten-silicon-nitride (WSiN)) on top of the word line layer to form a resistive layer. Next, depositing a conductive material (e.g., carbon (C)) on top of the resistive layer to form an electrode layer. Next, depositing a storage material (e.g., a chalcogenide, ferroelectric, or capacitive material) on top of the electrode layer to form a storage device layer. Next, depositing a conductive material (e.g., C) on top of the storage device layer to form a second electrode layer. Next, depositing a second resistive layer (e.g., WSiN) on top of the second electrode layer to form a second resistive layer.

Then to increase a resistance of the second resistive layer, covering a portion of the second resistive layer corresponding to the second region on the memory layer. And treating the uncovered surface of the second resistive layer (i.e., the first region of the memory layer) with a material that increases the resistance of the second resistive layer—e.g., by applying a dinitrogen ($N_2$) plasma to the second resistive layer. Alternatively, to increase a resistance of the second resistive layer, covering a portion of the second resistive layer corresponding to the second region on the memory layer. And implanting ions in the uncovered surface of the second resistive layer.

After increasing the resistance of the uncovered portion of the second resistive layer, the second region may be uncovered, and a second conductive material (e.g., W) may be deposited on top of the entire memory layer to form a bit line layer. Last, the resulting material stack may be etched to form multiple memory stacks dispersed across the memory layer, in addition to word lines and bit lines for access the multiple memory stacks. Accordingly, memory stacks located in the first region may have a higher standalone and/or internal access resistance than memory stacks located in the second region, and thus, the range of effective resistances of the memory stacks may be narrowed.

In some examples, additional regions of a memory layer may be defined (e.g., based on additional electrical and/or physical distance thresholds) and a resistance of memory devices in the additional regions may be similarly increased. For example, a standalone and/or internal access resistance of memory stacks located in a third region of the memory layer may be increased relative to the first and second regions by also performing the steps for increasing the resistance of the second resistive layer to the first resistive layer after the first resistive layer may be deposited and while the first and second regions are covered. In some examples, the resistance of other layers, rather than or in addition to, a resistive layer (e.g., a bit or word line layer) may be increased by the application of a plasma or by ion implantation.

In some examples, first memory devices (e.g., low ED or near memory devices) located in a first region may be formed to have a higher standalone and/or internal access resistance relative to second memory devices (e.g., high ED or far memory devices) located in a second region by converting an electrode layer of the first memory devices into an electrode bi-layer, as discussed herein and with reference to FIG. 6. Such a forming process may include first depositing a layer of conductive material (e.g., W) to form a word line layer. Next, depositing a resistive material (e.g., (WSiN)) on top of the word line layer to form a resistive layer. Next, depositing a conductive material (e.g., C) on top of the resistive layer to form an electrode layer. Next, depositing a storage material (e.g., a chalcogenide, ferroelectric, or capacitive material) on top of the electrode layer to form a storage device layer. Next, depositing a conductive material (e.g., C) on top of the storage device layer to form a second electrode layer.

Then to increase a resistance of memory devices located in the first region, covering a portion of the second electrode layer corresponding to the second region on the memory layer. Removing a portion of the conductive material from the uncovered surface of the second electrode layer (i.e., the first region of the memory layer). And depositing a reduced conductivity/increased resistivity material (e.g., silicon-carbide (SiC)) on top of the remaining portion of the second electrode layer, forming an increased resistivity electrode bi-layer.

After forming the electrode bi-layer, the second region may be uncovered and a second resistive layer (e.g., WSiN) may be deposited on top of the electrode bi-layer in the first region and the second electrode layer in the second region to form a second resistive layer. Then, a second conductive material (e.g., W) may be deposited on top of the entire memory layer to form a bit line layer. Last, the resulting material stack may be etched to form multiple memory stacks dispersed across the memory layer, in addition to word lines and bit lines for access the multiple memory stacks. Accordingly, memory stacks located in the first region may have a higher standalone and/or internal access resistance than memory stacks located in the second region, and thus, the range of effective resistances of the memory stacks may be narrowed.

In some examples, additional regions of a memory layer may be defined (e.g., based on additional electrical and/or physical distance thresholds) and a resistance of memory devices in the additional regions may be similarly increased. For example, a standalone and/or internal access resistance of memory stacks located in a third region of the memory layer may be increased relative to the first and second regions by also forming an electrode bi-layer from the first electrode layer. In some examples, the resistance of other layers, rather than or in addition to, an electrode layer (e.g., a bit or word line layer) may be increased by forming a reduced conductivity bi-layer.

In some examples, first memory devices (e.g., low ED or near memory devices) located in a first region may be formed to have a higher standalone and/or internal access resistance relative to second memory devices (e.g., high ED or far memory devices) located in a second region by removing all or a portion of one or more resistive layers from the second memory devices, as discussed herein and with reference to FIGS. 5, 8, and/or 11. Such a forming process may include first depositing a layer of conductive material (e.g., W) to form a word line layer. Next, depositing a resistive material (e.g., (WSiN)) on top of the word line layer to form a resistive layer. Next, depositing a conductive material (e.g., C) on top of the resistive layer to form an electrode layer. Next, depositing a storage material (e.g., a chalcogenide, ferroelectric, or capacitive material) on top of the electrode layer to form a storage device layer. Next, depositing a conductive material (e.g., C) on top of the storage device layer to form a second electrode layer. Next, depositing a second resistive layer (e.g., WSiN) on top of the second electrode layer to form a second resistive layer.

Then to decrease a resistance of memory devices located in the second region, covering a portion of the second resistive layer corresponding to the first region on the memory layer. And removing all or a portion of the resistive material from the uncovered surface of the second resistive layer (i.e., the second region of the memory layer). In some examples, the standalone and/or internal access resistance of memory cells in the second region decreases as more resistive material is removed.

After removing all or the portion of the second resistive layer from the uncovered portion, the first region may be uncovered and a second conductive material (e.g., W) may be deposited on top of the entire memory layer. Last, the resulting material stack may be etched to form multiple memory stacks dispersed across the memory layer, in addition to word lines and bit lines for access the multiple memory stacks. Accordingly, memory stacks located in the first region may have a lower standalone and/or internal access resistance than memory stacks located in the second region, and thus, the range of effective resistances of the memory stacks may be narrowed.

In some examples, additional regions of a memory layer may be defined (e.g., based on additional electrical and/or physical distance thresholds) and a resistance of memory devices in the additional regions may be similarly decreased. For example, a standalone and/or internal access resistance of memory stacks located in a third region of the memory layer may be decreased relative to the first and second regions by also removing more resistive material from the second resistive layer than from the second region and/or by also removing all or a portion of the resistive material from the first resistive layer. In some examples, the resistance of other layers, rather than or in addition to, a resistive layer (e.g., a word or bit line layer) may be increased by the thinning of the layer.

Any combination of the above formation techniques may be used to form memory stacks having different resistance. In some instances, a different formation technique or combination of formations techniques may be used in each region of a memory layer. Accordingly, the above formation techniques may support a memory layer having multiple regions (e.g., from two to dozens of regions). In some examples, dummy lines may be inserted at the borders of a mask used to cover a particular region of a memory layer— e.g., to prevent damage to access lines on the periphery of the mask.

In some examples, removing or treating a memory layer includes removing or treating the via areas on that memory layer. In other cases, removing or treating a memory layer does not include removing or treating the via areas on that memory layer—e.g., by covering the via areas during the removal or treatment step. Selectively removing or treating via areas may provide another means for modulating the effective resistance of a memory stack.

Figure 15:
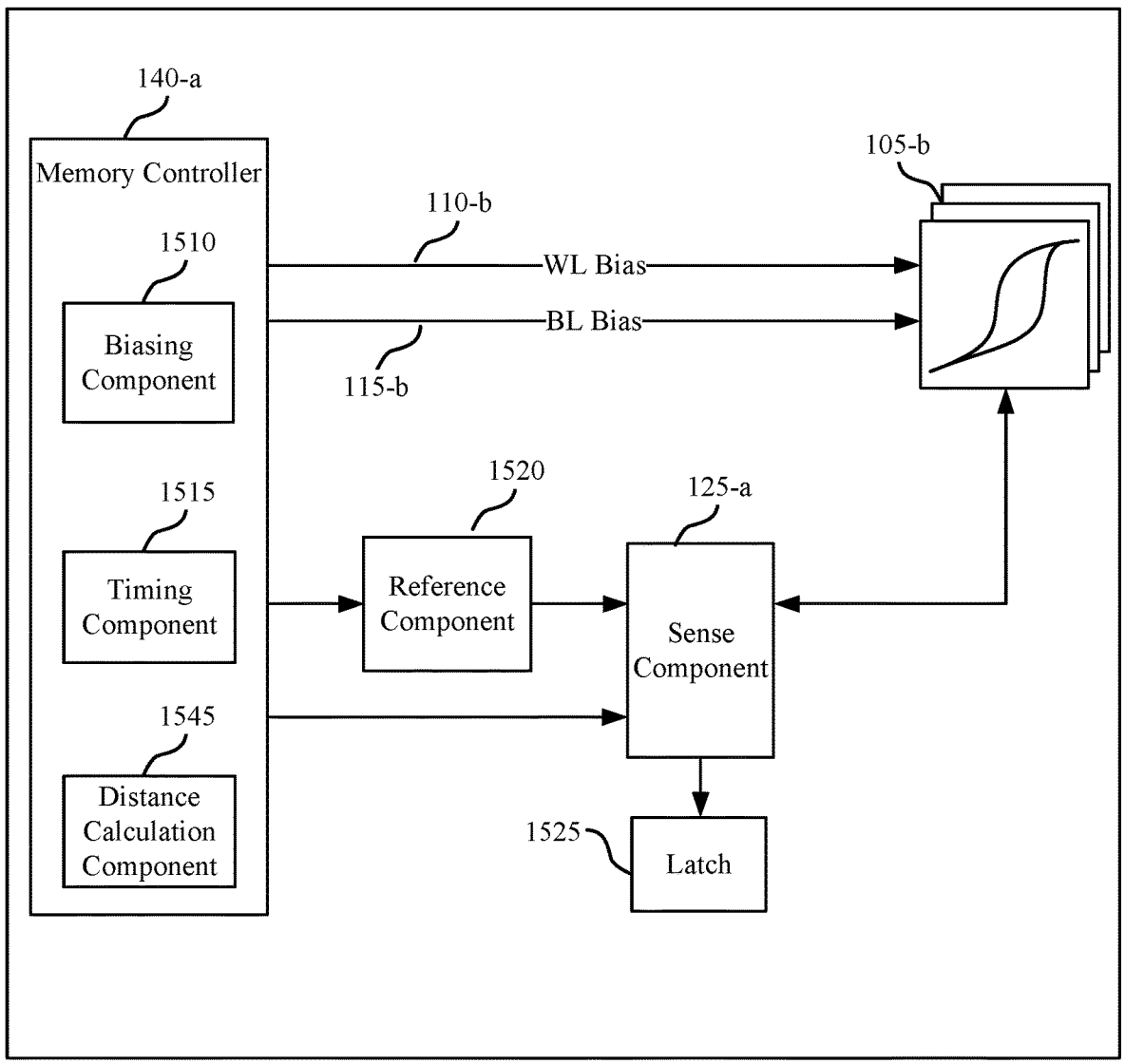
FIG. 15 illustrates an example memory system that supports a memory array with graded memory stack resistances as disclosed herein.

FIG. 15 illustrates an example memory array that supports a memory array with graded memory stack resistances as disclosed herein. Memory system 1500 may be referred to as an electronic memory apparatus and includes memory controller 140-a and memory cells 105-b, which may be examples of memory controller 140 and memory cells 105 described with reference to FIGS. 1 and 2. Memory system 1500 may also include reference component 1520 and latch 1525. The components of memory system 1500 may be in electronic communication with each other and may perform the functions described with reference to FIGS. 1 through 14. In some examples, reference component 1520, sense component 125-a and latch 1525 may be components of memory controller 140-a.

Memory controller 140-a may, in combination with other components, apply voltages throughout memory system 1500, write data to memory cells 105-b, read data from memory cells 105-b, and generally operate memory system 1500 as described in FIGS. 1 through 14. Memory controller 140-a may include biasing component 1510 and timing component 1515. In some examples, memory controller may include distance calculation component 1545. Memory controller 140-a may be in electronic communication with word line 110-b, bit line 115-b, and sense component 125-a, which may be examples of a word line 110, bit line 115, and sense component 125, as described with reference to FIGS. 1 and 2.

Memory controller 140-a may be configured to activate word line 110-b or bit line 115-b by applying voltages to those various nodes. For example, biasing component 1510 may be configured to apply a voltage to word line 110-b and/or bit line 115-b to read or write memory cell 105-b, as described herein. In some examples, memory controller 140-a may include a row decoder, column decoder, or both, as described with reference to FIG. 1. This may enable memory controller 140-a to access one or more memory cells 105. Biasing component 1510 may also provide voltage potentials to reference component 1520 to generate a reference signal for sense component 125-a. Additionally, biasing component 1510 may provide voltage potentials for the operation of sense component 125-a.

In some examples, memory controller 140-a may perform its operations using timing component 1515. For example, timing component 1515 may control the timing of the various word line selections or plate biasing, including timing for switching and voltage application to perform the memory functions, such as reading and writing, discussed herein. In some examples, timing component 1515 may control the operations of biasing component 1510.

Reference component 1520 may include various components to generate a reference signal for sense component 125-a. Reference component 1520 may include circuitry configured to produce a reference signal.

Memory cells 105-b may have different resistance based on an electrical distance and/or location on a memory layer relative to a word line driver and/or bit line driver. For example, memory cells located farther from the word line driver and/or bit line driver may have lower resistances than memory cells located nearer to the word line driver and/or bit line driver. In some examples, memory cells 105-b may be included in memory stacks.

Sense component 125-a may compare a signal from memory cell 105-b (through bit line 115-b) with a reference signal from reference component 1520. Upon determining the logic state, the sense component may then store the output in latch 1525, where it may be used in accordance with the operations of an electronic device that memory system 1500 is a part.

Distance calculation component 1545 may be configured to determine an electrical distance of memory cells 105-b or of memory cell locations on a memory layer. In some examples, distance calculation component 1545 determines an electrical distance of each memory cell or memory cell locations on a memory layer. In some examples, distance calculation component 1545 determines the first threshold electrical distance based at least in part on a distribution of a calculated voltage change throughout the memory layer. In some examples, distance calculation component 1545 calculates a plurality of electrical distances for a plurality of locations on the memory layer and identifies a first subset of the plurality of locations having an electrical distance that is less than or equal to the first threshold electrical distance based at least in part on the calculating. For instance, distance calculation component 1545 may calculate a third electrical distance for a first location on the memory layer that is located a first distance away from the word line driver and a second distance away from the bit line driver and determine that the third electrical distance is greater than the first threshold electrical distance based at least in part on the calculating.

In some examples, the electrical distance information determined by distance calculation component 1545 may be used to form memory cells on the memory layer or on a memory layer of a different memory system. In some examples, distance calculation component 1545 may be further configured to determine a distribution of a voltage spike throughout a memory layer.

Figure 16:
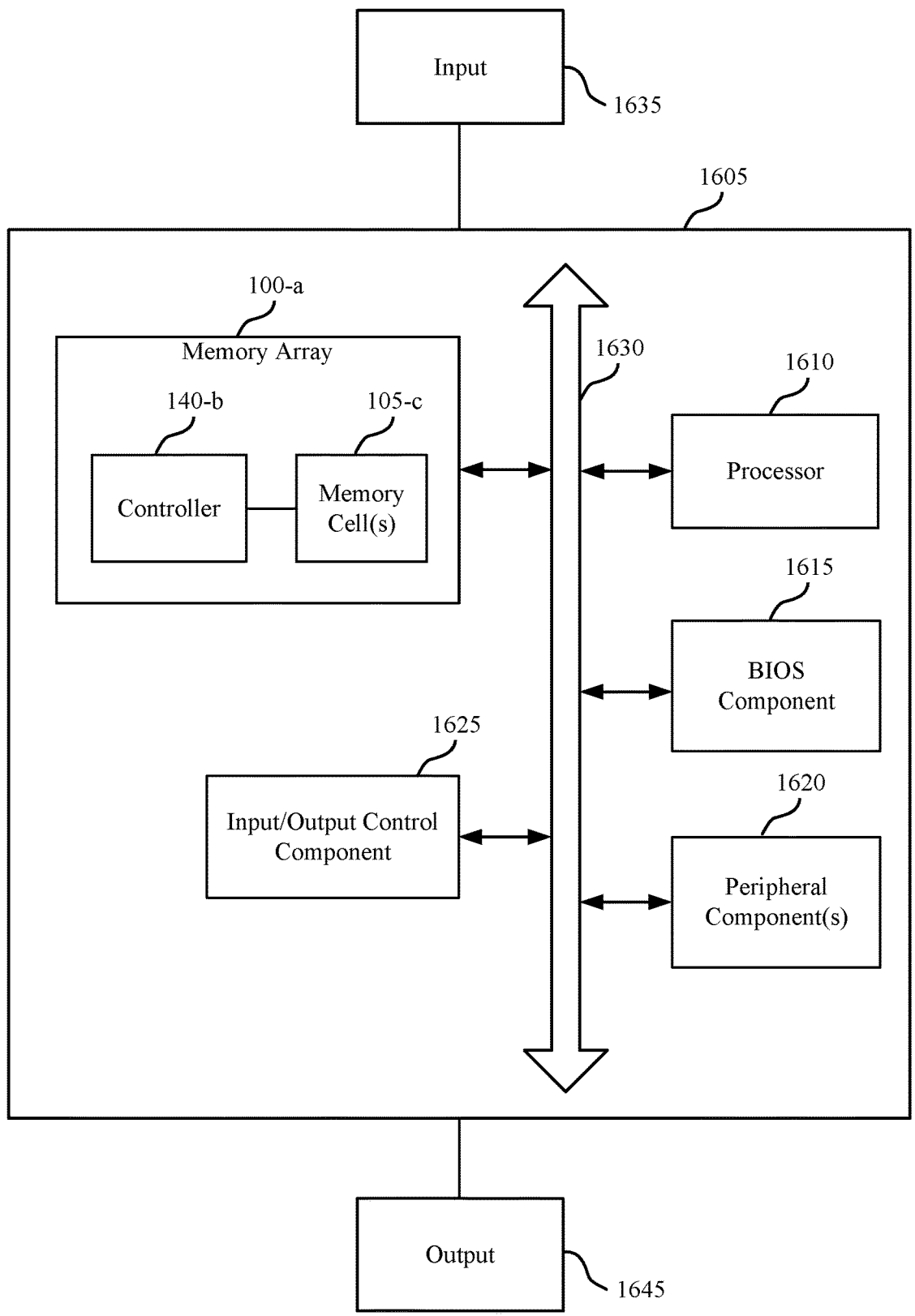
FIG. 16 illustrates an example system that supports a memory array with graded memory stack resistances as disclosed herein.

FIG. 16 illustrates an example system that supports a memory array with graded memory stack resistances as disclosed herein. System 1600 includes a device 1605, which may be or include a printed circuit board to connect or physically support various components. Device 1605 includes a memory system 100-*a*, which may be an example of memory system 100 described with reference to FIG. 1. Memory system 100-*a* may contain memory controller 140-*b* and memory cell(s) 105-*c*, which may be examples of memory controller 140 and memory cells 105 described with reference to FIGS. 1, 2, and 15. Device 1605 may also include a processor 1610, BIOS component 1615, peripheral component(s) 1620, and input/output control component 1625. The components of device 1605 may be in electronic communication with one another through bus 1630.

Processor 1610 may be configured to operate memory system 100-*a* through memory controller 140-*b*. In some examples, processor 1610 may perform the functions of memory controller 140 described with reference to FIGS. 1 and 15. In other cases, memory controller 140-*b* may be integrated into processor 1610. Processor 1610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1610 may perform various functions described herein. Processor 1610 may, for example, be configured to execute computer-readable instructions stored in memory system 100-*a* to cause device 1605 perform various functions or tasks.

BIOS component 1615 may be a software component that includes a basic input/output system (BIOS) operated as firmware, which may initialize and run various hardware components of system 1600. BIOS component 1615 may also manage data flow between processor 1610 and the various components, e.g., peripheral components 1620, input/output control component 1625, etc. BIOS component 1615 may include a program or software stored in read-only memory (ROM), flash memory, or any other non-volatile memory.

Peripheral component(s) 1620 may be any input or output device, or an interface for such devices, that is integrated into device 1605. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1625 may manage data communication between processor 1610 and peripheral component(s) 1620, input devices 1635, or output devices 1640. Input/output control component 1625 may also manage peripherals not integrated into device 1605. In some examples, input/output control component 1625 may represent a physical connection or port to the external peripheral.

Input devices 1635 may represent a device or signal external to device 1605 that provides input to device 1605 or its components. This may include a user interface or interface with or between other devices. In some examples, input devices 1635 may be a peripheral that interfaces with device 1605 via peripheral component(s) 1620 or may be managed by input/output control component 1625.

Output devices 1640 may represent a device or signal external to device 1605 configured to receive output from device 1605 or any of its components. Examples of output devices 1640 may include a display, audio speakers, a printing device, another processor or printed circuit board, etc. In some examples, output devices 1640 may be a peripheral that interfaces with device 1605 via peripheral component(s) 1620 or may be managed by input/output control component 1625.

The components of memory controller 140-*b*, device 1605, and memory system 100-*a* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 17:
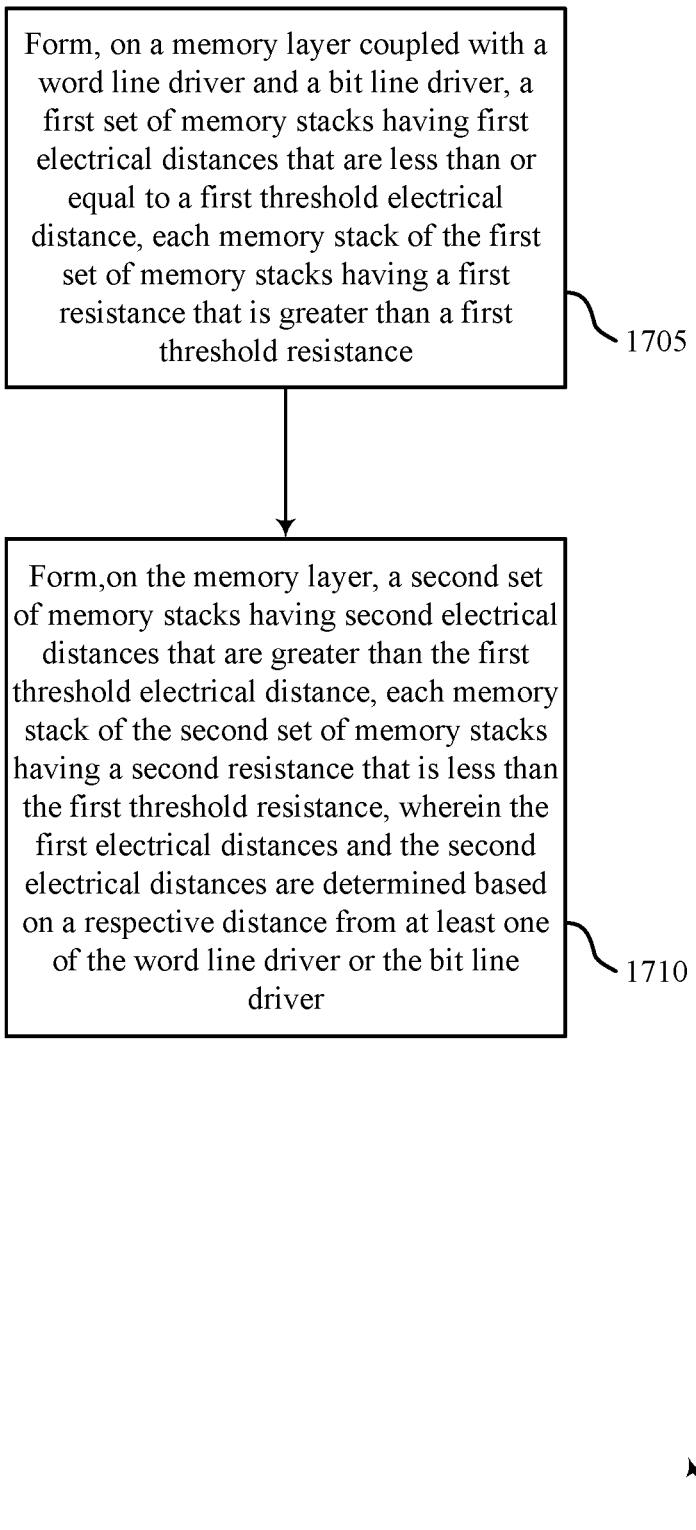
FIG. 17 illustrates aspects of a method for forming a memory array with graded memory stack resistances as disclosed herein.

FIG. 17 illustrates a flowchart of a method or methods for forming a memory array with graded memory stack resistances as disclosed herein. Method 1700 may illustrate aspects of the formation of memory stacks on a memory layer based on an electrical distance of the memory stacks from a word line driver and/or a bit line driver. The operations of method 1700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special purpose hardware.

At block 1705, the method may include forming, on a memory layer coupled with a word line driver and a bit line driver, a first set of memory stacks having first electrical distances that are less than or equal to a first threshold electrical distance, each memory stack of the first set of memory stacks having a first resistance that is greater than a first threshold resistance, as described with reference to FIGS. 3 through 14.

At block 1710, the method may include forming, on the memory layer, a second set of memory stacks having second electrical distances that are greater than the first threshold electrical distance, each memory stack of the second set of memory stacks having a second resistance that is less than the first threshold resistance, wherein the first electrical distances and the second electrical distances are determined based on a respective distance from at least one of the word line driver or the bit line driver, as described with reference to FIGS. 3 through 14.

In some examples, the manufacturing system as described herein may include features, means, or instructions (e.g., a non-transitory computer-readable medium storing instructions executable by a processor) for forming, on a memory layer coupled with a word line driver and a bit line driver, a first set of memory stacks having first electrical distances that are less than or equal to a first threshold electrical distance, each memory stack of the first set of memory stacks having a first resistance; and forming, on the memory layer, a second set of memory stacks having second electrical distances that are greater than the first threshold electrical distance, each memory stack of the second set of memory stacks having a second resistance that is less than the first resistance, wherein the first electrical distances and the second electrical distances are determined based on a respective distance from at least one of the word line driver or the bit line driver.

In some examples, the features, means, or instructions for forming the first set of memory stacks may include covering a surface of the second set of memory stacks; and treating a surface of or implanting ions into the first set of memory stacks.

In some examples, the features, means, or instructions for forming the second set of memory stacks includes removing a resistive layer from the second set of memory stacks.

In some examples, the manufacturing system herein may include features, means, or instructions for determining the first threshold electrical distance based at least in part on a distribution of a calculated voltage change throughout the memory layer, the calculated voltage change associated with an application of a voltage by at least one of the word line driver or the bit line driver, wherein the first set of memory stacks and the second set of memory stacks are formed based at least in part on determining the first threshold electrical distance.

In some examples, the manufacturing system herein may include features, means, or instructions for calculating a plurality of electrical distances for a plurality of locations on the memory layer; and identifying a first subset of the plurality of locations having an electrical distance that is less than or equal to the first threshold electrical distance based at least in part on the calculating, wherein the first set of memory stacks are formed at the first subset of the plurality of locations based at least in part on identifying the first subset of the plurality of locations.

In some examples, the manufacturing system herein may include features, means, or instructions for calculating a third electrical distance for a first location on the memory layer that is located a first distance away from the word line driver and a second distance away from the bit line driver; and determining that the third electrical distance is greater than the first threshold electrical distance based at least in part on the calculating, wherein a memory stack of the second set of memory stacks is formed at the first location based at least in part on determining that the third electrical distance is greater than the first threshold electrical distance.

In some examples of the method, means for, apparatuses, and non-transitory computer-readable medium described herein, the second electrical distances are less than or equal to a second threshold electrical distance and the method, apparatuses, and non-transitory computer-readable medium described herein may further include operations, features, means, or instructions for forming, on the memory layer, a third set of memory stacks having third electrical distances that are greater than the second threshold electrical distance and less than or equal to a third threshold electrical distance, wherein each of the third subset of memory stacks has a third resistance that is less than the second resistance; and forming, on the memory layer, a fourth set of memory stacks having fourth electrical distances that are greater than the third threshold electrical distance, wherein each of the fourth subset of memory stacks has a fourth resistance that is less than the third resistance, and wherein the third electrical distances and the fourth electrical distances are determined based on a respective distance from at least one of the word line driver or the bit line driver.

In some examples of the method, means for, apparatuses, and non-transitory computer-readable medium described herein, forming a first memory stack of the first set of memory stacks includes forming a first word line layer coupled with the first driver component, a resistive layer in contact with the first word line layer, and a first electrode layer in contact with the resistive layer. And forming a second memory stack of the second set of memory stacks includes forming a second word line layer coupled with the first driver component, and a second electrode layer in contact with the second word line layer.

In some examples of the method, means for, apparatuses, and non-transitory computer-readable medium described herein, forming a first memory stack of the first set of memory stacks includes forming a first bit line layer coupled with the second driver component, a first resistive layer in contact with the first bit line layer, a reduced-conductivity electrode layer in contact with the first resistive layer, and a first electrode layer in contact with the reduced-conductivity electrode layer. And forming a second memory stack of the second set of memory stacks includes forming a second bit line layer coupled with the second driver component, a second resistive layer in contact the second bit line layer, and a second electrode layer in contact with the second resistive layer.

It should be noted that the methods described above describe possible implementations, and that the operations and the steps may be rearranged or otherwise modified and that other implementations are possible. Furthermore, embodiments from two or more of the methods may be combined.

In some examples, the manufacturing system may form an apparatus or device as described herein. For example, the manufacturing system may form an apparatus or device that includes a first driver component; a second driver component; and memory stacks coupled with the first driver component and the second driver component and including a first subset of memory stacks having first electrical distances that are less than or equal to a first threshold electrical distance, each memory stack of the first subset of memory stacks comprising a first plurality of material layers, wherein a first combined resistance of the first plurality of material layers is greater than a first threshold resistance; and a second subset of memory stacks having second electrical distances that are greater than the first threshold electrical distance, each memory stack of the second subset of memory stacks comprising a second plurality of material layers, wherein a second combined resistance of the second plurality of material layers is less than or equal to the first threshold resistance, wherein the first electrical distances and the second electrical distances based at least in part on a distance from at least one of the first driver component or the second driver component.

In some examples, the apparatus or device includes a memory layer coupled with the first driver component and the second driver component and including a first region comprising the first subset of memory stacks; and a second region comprising the second subset of memory stacks. In some examples of the apparatus or device, the first region and the second region are contiguous regions. In some examples of the apparatus or device, each memory stack of the first subset of memory stacks comprises a respective storage component, and wherein each of the first plurality of material layers has a resistance that varies less than a resistance of storage components varies, and each memory stack of the first subset of memory stacks comprises a respective storage component, and wherein each of the second plurality of material layers has a resistance that varies less than a resistance of storage components varies. In some examples of the apparatus or device, the first plurality of material layers comprises a set of material layers excluding a first storage layer and the first plurality of material layers comprises a set of material layers excluding a second storage layer.

In some examples, the apparatus or device includes a plurality of memory layers coupled with the first driver component and the second driver component. In other examples, the plurality of memory layers is coupled with a respective first driver component and second driver component of a plurality of driver components. In some examples, the plurality of memory layers includes the memory layer and a second memory layer, and the second memory layer includes a third subset of memory stacks having third electrical distances that are less than or equal to a third threshold electrical distance, each memory stack of the third subset of memory stacks having a third resistance.

In some examples of the apparatus or device, a first memory stack of the first subset of memory stacks includes a first word line layer coupled with the first driver component, a resistive layer in contact with the first word line layer, and a first electrode layer in contact with the resistive layer. And a second memory stack of the second subset of memory stacks includes a second word line layer coupled with the first driver component, and a second electrode layer in contact with the second word line layer.

In some examples of the apparatus or device, a first memory stack of the first subset of memory stacks includes a first bit line layer coupled with the second driver component, a first resistive layer in contact with the first bit line layer, a first electrode layer in contact with the first resistive layer, and a second electrode layer in contact with the first electrode layer, the second electrode layer having a lower conductivity than the first electrode layer. And a second memory stack of the second subset of memory stacks includes a second bit line layer coupled with the second driver component, a second resistive layer in contact the second bit line layer, and a third electrode layer in contact with the second resistive layer. In some examples, a combined height of the first electrode layer and the second electrode layer is equivalent to a height of the third electrode layer.

In some examples of the apparatus or device, a first memory stack of the first subset of memory stacks includes a first word line layer coupled with the first driver component, and a first resistive layer in contact with the first word line layer and having a first thickness. And a second memory stack of the second subset of memory stacks includes a second word line layer coupled with the first driver component, and a second resistive layer in contact with the second word line layer and having a second thickness less than the first thickness.

In some examples, the second electrical distances are less than or equal to a second threshold electrical distance, and the apparatus or device includes a third subset of memory stacks having third electrical distances that are greater than the second threshold electrical distance and less than or equal to a third threshold electrical distance, wherein each of the third subset of memory stacks has a third resistance that is less than the second resistance, and a fourth subset of memory stacks having fourth electrical distances that are greater than the third threshold electrical distance, wherein each of the fourth subset of memory stacks has a fourth resistance that is less than the third resistance, and wherein the third electrical distances and the fourth electrical distances are based at least in part on a distance from at least one of the first driver component or the second driver component.

In some examples of the apparatus or device, a third memory stack of the third subset of memory stacks includes a third word line layer coupled with the first driver component, and a third resistive layer in contact with the third word line layer and having a third thickness less than the second thickness. And a fourth memory stack of the fourth subset of memory stacks comprises a fourth word line layer coupled with the first driver component, and an electrode layer in contact with the fourth word line layer.

In some examples of the apparatus or device, a memory stack of the memory stacks comprises a self-selecting storage component and a resistive layer composed of WSiN. In some examples, of the apparatus or device, a memory stack of the memory stacks comprises a storage component in a three-dimensional cross-point memory structure.

In some examples, the apparatus or device includes a via coupled with the memory stack and at least one of the first driver component or the second driver component.

In another example, the manufacturing system may form an apparatus or device that includes a word line driver; a bit line driver; a first memory stack having a first resistance based at least in part on a first electrical distance of the first memory stack, the first electrical distance based at least in part on a first distance between the first memory stack and at least one of the word line driver or the bit line driver; and a second memory stack having a second resistance that is less than the first resistance based at least in part on a second electrical distance of the second memory stack that is greater than the first electrical distance, the second electrical distance based at least in part on a second distance between the second memory stack and at least one of the word line driver or the bit line driver.

In some examples, the first electrical distance corresponds to a combination of a first aggregate resistance associated with the first memory stack and the word line driver and a second aggregate resistance associated with the first memory stack and the bit line driver; and the second electrical distance corresponds to a combination of a third aggregate resistance associated with the second memory stack and the word line driver and a fourth aggregate resistance associated with the second memory stack and the bit line driver.

In some examples, the first electrical distance is based at least in part on a location of the first memory stack relative to at least one of a location of the word line driver or a location of the bit line driver; and the second electrical distance is based at least in part on a location of the second memory stack relative to at least one of a location of the word line driver or a location of the bit line driver.

In some examples, the apparatus or device includes a memory layer comprising the first memory stack and the second memory stack, where a first location on the memory layer located a third distance from the word line driver and a fourth distance from the bit line driver are associated with the first electrical distance; and a second location on the memory layer located a fifth distance from the word line driver and a sixth distance from the bit line driver are associated with the second electrical distance, wherein the third distance and the fourth distance are greater than the first distance and the second distance, respectively.

In some examples of the apparatus or device, the first memory stack has the first resistance based at least in part on the first electrical distance being less than or equal to a first threshold electrical distance; and the second memory stack has the second resistance based at least in part on the second electrical distance being greater than the first threshold electrical distance.

In another example, the manufacturing system may form an apparatus or device that includes a word line driver; a bit line driver; and a memory layer coupled with the word line driver and the bit line driver and including a first memory stack constructed to have a first resistance based at least in part on a first distance between the first memory stack and at least one of the word line driver or the bit line driver; and a second memory stack constructed to have a second resistance lower than the first resistance based at least in part on a second distance between the second memory stack and at least one of the word line driver or the bit line driver.

In some examples of the apparatus or device, the word line driver is located on a first side of the memory layer and the bit line driver is located on a second side of the memory layer.

In some examples of the apparatus or device, the first memory stack includes a first word line layer coupled with the word line driver, a first resistive layer above and contacting the first word line layer, a second resistive layer above the first resistive layer, and a first bit line layer above and contacting the second resistive layer and coupled with the bit line driver. And the second memory stack includes a second word line layer coupled with the word line driver, a first electrode layer above and contacting the second word line layer, a third resistive layer above the first electrode layer, and a second bit line layer above and contacting the third resistive layer and coupled with the bit line driver.

In some examples of the apparatus or device, the memory layer includes a third memory stack constructed to have a third resistance less than or equal to the second resistance based at least in part on a third distance between the third memory stack and at least one of the word line driver and the bit line driver; and a fourth memory stack constructed to have a fourth resistance lower than the third resistance based at least in part on a fourth distance between the fourth memory stack and at least one of the word line driver and the bit line driver.

In some examples of the apparatus or device, the third memory stack includes a third word line layer coupled with the word line driver, a fourth resistive layer above and contacting the third word line layer, a second electrode layer above the fourth resistive layer, and a third bit line layer above and contacting the second electrode layer coupled with the bit line driver. And the fourth memory stack includes a fourth word line layer coupled with the word line driver, a third electrode layer above and contacting the fourth word line layer, a fourth electrode layer above the third electrode layer, and a fourth bit line layer above and contacting the fourth electrode layer and coupled with the bit line driver.

In some examples of the apparatus or device, the first memory stack is located within a fifth distance from the word line driver and within a sixth distance from the bit line driver; the second memory stack is located outside the fifth distance from the word line driver and within the sixth distance from the bit line driver; the third memory stack is located within the fifth distance from the word line driver and outside the sixth distance from the bit line driver; and the fourth memory stack is located outside the fifth distance from the word line driver and outside the sixth distance from the bit line driver.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some examples, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some examples, the exposed regions may remain, and the unexposed regions may be removed.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    forming, on a memory layer coupled with a word line driver and a bit line driver, a first set of memory stacks having first electrical distances that are less than or equal to a first threshold electrical distance, each memory stack of the first set of memory stacks having a first resistance that is greater than a first threshold resistance, wherein forming a first memory stack of the first set of memory stacks comprises forming:
        a first word line layer coupled with the word line driver, and
        a first resistive layer in contact with the first word line layer and having a first thickness; and
    forming, on the memory layer, a second set of memory stacks having second electrical distances that are greater than the first threshold electrical distance, each memory stack of the second set of memory stacks having a second resistance that is less than the first threshold resistance, wherein forming a second memory stack of the second set of memory stacks comprises forming:
        a second word line layer coupled with the word line driver, and
        a second resistive layer in contact with the second word line layer and having a second thickness less than the first thickness,
    wherein the first electrical distances and the second electrical distances are based on a respective distance from at least one of the word line driver or the bit line driver.

2. The method of claim 1, wherein forming the first set of memory stacks comprises:
    covering a surface of the second set of memory stacks; and
    treating a surface of or implanting ions into the first set of memory stacks.

3. The method of claim 1, wherein forming the second set of memory stacks comprises:
    removing the second resistive layer from the second set of memory stacks.

4. The method of claim 3, wherein:
    forming the first memory stack of the first set of memory stacks comprises forming:
        a first electrode layer in contact with the first resistive layer; and
    forming the second memory stack of the second set of memory stacks comprises forming:
        a second electrode layer in contact with the second word line layer.

5. The method of claim 1, further comprising:
    determining the first threshold electrical distance based at least in part on a distribution of a calculated voltage change throughout the memory layer, the calculated voltage change associated with an application of a voltage by at least one of the word line driver or the bit line driver, wherein the first set of memory stacks and the second set of memory stacks are formed based at least in part on determining the first threshold electrical distance.

6. The method of claim 1, further comprising:
    calculating a plurality of electrical distances for a plurality of locations on the memory layer; and
    identifying a first subset of the plurality of locations having an electrical distance that is less than or equal to the first threshold electrical distance based at least in part on the calculating, wherein the first set of memory stacks are formed at the first subset of the plurality of locations based at least in part on identifying the first subset of the plurality of locations.

7. The method of claim 1, further comprising:
    calculating a third electrical distance for a first location on the memory layer that is located a first distance away from the word line driver and a second distance away from the bit line driver; and
    determining that the third electrical distance is greater than the first threshold electrical distance based at least in part on the calculating, wherein the second memory stack of the second set of memory stacks is formed at the first location based at least in part on determining that the third electrical distance is greater than the first threshold electrical distance.

8. The method of claim 1, wherein:
    forming the first memory stack of the first set of memory stacks comprises forming:
        a first bit line layer coupled with the bit line driver;

a third resistive layer in contact with the first bit line layer;

a reduced-conductivity electrode layer in contact with the third resistive layer;

a first electrode layer in contact with the reduced-conductivity electrode layer; and forming the second memory stack of the second set of memory stacks comprises forming:

a second bit line layer coupled with the bit line driver;

a fourth resistive layer in contact the second bit line layer; and a second electrode layer in contact with the fourth resistive layer.

9. A method, comprising:

forming, on a memory layer coupled with a word line driver and a bit line driver, a first set of memory stacks having first electrical distances that are less than or equal to a first threshold electrical distance, each memory stack of the first set of memory stacks having a first resistance that is greater than a first threshold resistance;

forming, on the memory layer, a second set of memory stacks having second electrical distances that are greater than the first threshold electrical distance, each memory stack of the second set of memory stacks having a second resistance that is less than the first threshold resistance, wherein the first electrical distances and the second electrical distances are based on a respective distance from at least one of the word line driver or the bit line driver, and wherein the second electrical distances are less than or equal to a second threshold electrical distance;

forming, on the memory layer, a third set of memory stacks having third electrical distances that are greater than the second threshold electrical distance and less than or equal to a third threshold electrical distance, wherein each memory stack of the third set of memory stacks has a third resistance that is less than the second resistance; and forming, on the memory layer, a fourth set of memory stacks having fourth electrical distances that are greater than the third threshold electrical distance, wherein each memory stack of the fourth set of memory stacks has a fourth resistance that is less than the third resistance, and wherein the third electrical distances and the fourth electrical distances are based on a respective distance from at least one of the word line driver or the bit line driver.

10. A method, comprising:

forming, on a memory layer coupled with a first driver and a second driver, a first memory stack having, prior to storing information, a first resistance based at least in part on a first electrical distance of the first memory stack, the first electrical distance based at least in part on a first distance between the first memory stack and at least one of the first driver or the second driver, wherein forming the first memory stack comprises forming:

a first bit line layer coupled with the second driver, a first resistive layer in contact with the first bit line layer, a reduced-conductivity electrode layer in contact with the first resistive layer, and a first electrode layer in contact with the reduced-conductivity electrode layer; and forming, on the memory layer, a second memory stack having, prior to storing information, a second resistance that is less than the first resistance based at least in part on a second electrical distance of the second memory stack that is greater than the first electrical distance, the second electrical distance based at least in part on a second distance between the second memory stack and at least one of the first driver or the second driver, wherein forming the first memory stack comprises forming:

a second bit line layer coupled with the second driver, a second resistive layer in contact the second bit line layer, and a second electrode layer in contact with the second resistive layer.

11. The method of claim 10, wherein forming the first memory stack comprises:

covering a surface of the second memory stack; and treating a surface of or implanting ions into the first memory stack.

12. The method of claim 10, wherein forming the second memory stack comprises:

removing the second resistive layer from the second memory stack.

13. The method of claim 10, further comprising:

determining a first threshold electrical distance based at least in part on a distribution of a calculated voltage change throughout the memory layer, the calculated voltage change associated with an application of a voltage by at least one of the first driver or the second driver, wherein the first memory stack and the second memory stack are formed based at least in part on determining the first threshold electrical distance.

14. The method of claim 10, wherein:

forming the first memory stack comprises forming:

a first word line layer coupled with the first driver;

a third resistive layer in contact with the first word line layer;

a third electrode layer in contact with the third resistive layer; and forming the second memory stack comprises forming:

a second word line layer coupled with the first driver; and a fourth electrode layer in contact with the second word line layer.

15. A method, comprising:

forming, on a memory layer coupled with a first driver and a second driver, a first memory stack comprising a first storage component and having a first resistance based at least in part on a first distance between the first memory stack and at least one of the first driver or the second driver, wherein the first resistance is based at least in part on the first storage component being configured in a first state, wherein forming the first memory stack comprises forming:

a first bit line layer coupled with the second driver, a first resistive layer in contact with the first bit line layer, a reduced-conductivity electrode layer in contact with the first resistive layer, and a first electrode layer in contact with the reduced-conductivity electrode layer; and forming, on the memory layer, a second memory stack comprising a second storage component and having a second resistance lower than the first resistance based at least in part on a second distance between the second memory stack and at least one of the first driver and the second driver, wherein the second resistance is based at least in part on the second storage component being configured in the first state, wherein forming the second memory stack comprises forming:
- a second bit line layer coupled with the second driver,
- a second resistive layer in contact with the second bit line layer, and
- a second electrode layer in contact with the second resistive layer.

16. The method of claim 15, wherein forming the first memory stack comprises:
- covering a surface of the second memory stack; and
- treating a surface of or implanting ions into the first memory stack.

17. The method of claim 15, wherein forming the second memory stack comprises:
- removing the second resistive layer from the second memory stack.

18. The method of claim 15, wherein:
- forming the first memory stack comprises forming:
  - a first word line layer coupled with the first driver;
  - a third resistive layer in contact with the first word line layer;
  - a third electrode layer in contact with the third resistive layer; and
- forming the second memory stack comprises forming:
  - a second word line layer coupled with the first driver; and
  - a fourth electrode layer in contact with the second word line layer.

* * * * *